(12) United States Patent
Kido

(10) Patent No.: US 6,791,145 B2
(45) Date of Patent: Sep. 14, 2004

(54) SEMICONDUCTOR DEVICE FORMED BY UTILIZING DEFORMED PATTERN

(75) Inventor: Shusaku Kido, Kagoshima (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 0 days.

(21) Appl. No.: 10/778,041

(22) Filed: Feb. 17, 2004

(65) Prior Publication Data

US 2004/0159890 A1 Aug. 19, 2004

Related U.S. Application Data

(62) Division of application No. 10/300,735, filed on Nov. 21, 2002, which is a division of application No. 09/888,442, filed on Jun. 26, 2001, now Pat. No. 6,707,107.

(30) Foreign Application Priority Data

Jun. 26, 2000 (JP) .......................................... 2000-191419
May 25, 2001 (JP) .......................................... 2001-157209

(51) Int. Cl.[7] .......................... H01L 27/01; H01L 29/06; H01L 29/04
(52) U.S. Cl. ........................... 257/354; 257/52; 257/57; 257/66; 257/72; 257/347; 257/349; 257/401; 257/620; 257/622
(58) Field of Search .............................. 257/52, 57, 66, 257/72, 347, 349, 354, 401, 620, 622

(56) References Cited

U.S. PATENT DOCUMENTS

| 5,728,604 A | 3/1998 | Rha et al. |
| 6,114,184 A | 9/2000 | Matsumoto et al. |
| 6,201,281 B1 | 3/2001 | Miyazaki et al. |
| 2003/0062523 A1 | 4/2003 | Bae et al. |

FOREIGN PATENT DOCUMENTS

| JP | 3-59-154073 | 9/1984 |
| JP | 59-200421 | 11/1984 |
| JP | 60-2948 | 1/1985 |
| JP | 4-1-103864 | 4/1989 |
| JP | 1-239848 | 9/1989 |
| JP | 4-4-180031 | 6/1992 |
| JP | 4-8-32072 | 2/1996 |

Primary Examiner—John F. Niebling
Assistant Examiner—Stanetta Isaac
(74) Attorney, Agent, or Firm—Young & Thompson

(57) ABSTRACT

A method of deforming a pattern comprising the steps of: forming, over a substrate, a layered-structure with an upper surface including at least one selected region and at least a re-flow stopper groove, wherein the re-flow stopper groove extends outside the selected region and separate from the selected region; selectively forming at least one pattern on the selected region; and causing a re-flow of the pattern, wherein a part of an outwardly re-flowed pattern is flowed into the re-flow stopper groove, and then an outward re-flow of the pattern is restricted by the re-flow stopper groove extending outside of the pattern, thereby to form a deformed pattern with at least an outside edge part defined by an outside edge of the re-flow stopper groove.

5 Claims, 54 Drawing Sheets

SEMICONDUCTOR DEVICE FORMED BY UTILIZING DEFORMED PATTERN

This application is a division of application Ser. No. 10/300,735, filed on Nov. 21, 2002, which is a Divisional of application Ser. No. 09/888,442, filed on Jun. 26, 2001 now U.S. Pat. No. 6,707,107, and application Ser. No. 09/888,442 is the parent of Divisional application Ser. No. 10/201,132 filed on Jul. 24, 2002, the entire contents of which are hereby incorporated by reference.

BACKGROUND OF THE INVENTION

1. Field of the Invention

The present invention relates to a method of deforming a resist pattern to be used for forming a semiconductor device, and more particularly to a method of improving the accuracy in the quantity of deformation of an original resist pattern or improving a highly accurate control to a pattern shape of a reflow-deformed resist pattern.

2. Description of the Related Art

A conventional well known method of deforming the original resist pattern is a re-flow process by heating the original resist pattern. A quantity of deformation of the resist pattern or a difference in size of the deformed resist pattern from the original resist pattern is relatively small, for example, in the range of 0.5 micrometers to 3 micrometers.

Another conventional well known method of deforming the original resist pattern is to dip the original resist pattern into chemicals or expose the original resist pattern to a steam containing chemicals so that the chemicals osmose into the original resist pattern, whereby the original resist pattern is dissolved and deformed. A quantity of deformation of the resist pattern or a difference in size of the deformed resist pattern from the original resist pattern is relatively large, for example, in the range of 5 micrometers to 20 micrometers.

A high accuracy in the quantity of deformation of the resist pattern is desired. In order to obtain the high accuracy in quantity of the deformation, a highly accurate control to the quantity of deformation of the resist pattern is essential.

A conventional method of forming a thin film transistor utilizes the original resist pattern and the deformed resist pattern. FIG. 1A is a fragmentary plan view of a thin film transistor of a first step involved in conventional sequential fabrication processes. FIG. 1B is a fragmentary cross sectional elevation view of a thin film transistor shown in FIG. 1A, taken along a D–D' line. FIG. 2A is a fragmentary plan view of a thin film transistor of a second step involved in conventional sequential fabrication processes. FIG. 2B is a fragmentary cross sectional elevation view of a thin film transistor shown in FIG. 2A, taken along a D–D' line. FIG. 3A is a fragmentary plan view of a thin film transistor of a third step involved in conventional sequential fabrication processes. FIG. 3B is a fragmentary cross sectional elevation view of a thin film transistor shown in FIG. 3A, taken along a D–D' line. FIG. 4A is a fragmentary plan view of a thin film transistor of a fourth step involved in conventional sequential fabrication processes. FIG. 4B is a fragmentary cross sectional elevation view of a thin film transistor shown in FIG. 4A, taken along a D–D' line. A thin film transistor is formed over an insulating substrate 301.

With reference to FIGS. 1A and 1B, a metal layer is formed on a top surface of an insulating substrate 301. The metal layer is then patterned to form a gate electrode 302. A gate insulating film 303 is formed over the top surface of the insulating substrate 301 and over the gate electrode 302. An amorphous silicon film 304 is formed over the gate insulating film 303. An n+-type amorphous silicon film 305 is formed over the amorphous silicon film 304. A metal layer 306 is formed over the n+-type amorphous silicon film 305.

Thick resist masks 318 and thin resist masks 328 are selectively formed over the metal layer 306. The thick resist masks 318 are adjacent to a channel region 315. The thick resist masks 318 separates the thin resist masks 328 from the channel region 315. The thick resist masks 318 have a thickness of about 3 micrometers. The thin resist masks 328 have a thickness of about 0.2–0.7 micrometers. Each pair of the thick resist mask 318 and the thin resist mask 328 comprises a unitary-formed resist mask which varies in thickness.

With reference to FIGS. 2A and 2B, a first anisotropic etching process is carried out by using the thick and thin resist masks 318 and 328 for selectively etching the metal layer 306 and the n+-type amorphous silicon film 305, whereby the remaining parts of the n+-type amorphous silicon film 305 become a source side ohmic contact layer 310 and a drain side ohmic contact layer 311, and further the remaining parts of the metal layer 306 become a source electrode 313 and a drain electrode 314.

A plasma ashing process is carried out in the presence Of $O_2$ plasma for reducing the thickness of the resist masks, whereby the thin resist masks 328 are removed, while the thick resist masks 318 remain with a reduced thickness. These thickness-reduced resist masks 318 will hereinafter be referred to as residual resist masks 338. The residual resist masks 338 are adjacent to the channel region 315. These residual resist masks 338 provide the original resist patterns.

With reference to FIGS. 3A and 3B, the residual resist masks 338 are exposed to a steam for 1–3 minutes, wherein the steam contains an organic solvent, whereby the organic solvent gradually osmose into the residual resist masks 338 as the original resist patterns, so that the original resist pattern is dissolved and re-flowed, resulting in a reflow-deformed resist pattern 348 being formed. The reflow-deformed resist pattern 348 extends to the channel region 315 and outside regions of the residual resist masks 338 as the original resist patterns.

In the re-flow process, the residual resist masks 338 as the original resist patterns are inwardly re-flowed toward the channel region 315 and the re-flowed residual resist masks 338 come together over the channel region 315. An interconnection 302' connected to the gate electrode 302 extends in a parallel direction to the line D–D'. This interconnection 302' forms a step-like barrier wall 317-a to stop the reflow of the re-flowed residual resist masks 338, wherein the step-like barrier wall 317-a extends in the parallel direction to the line D–D'. A further step-like barrier wall 317-b is present, which extends in a perpendicular direction to the D–D' line.

For this reason, the reflow of the residual resist masks 338 is stopped but only in two directions by the step-like barrier walls 317-a and 371b. The reflow of the residual resist masks 338 is free and not limited in the remaining directions. It is difficult to control the reflow of the residual resist masks 338 in the remaining directions due to the absence of any reflow restrictor such as the step-like barrier walls 317-a and 371b. This means it difficult to control the pattern shape of the reflow-deformed resist mask 348.

With reference to FIGS. 4A and 4B, a second anisotropic etching process is carried out by use of the reflow-deformed resist mask 348 and the source and drain electrodes 313 and 314 as masks for selectively etching the amorphous silicon film 304, whereby the remaining part of the amorphous silicon film 304 becomes an island layer 324. A pattern shape of the island layer 324 is defined by the reflow-deformed resist mask 348 in combination with additional masks of the source and drain electrodes 313 and 314. The used reflow-deformed resist mask 348 is removed. As a result, a reverse staggered thin film transistor is formed.

As described above, the pattern shape of the island layer 324 is defined by the reflow-deformed resist mask 348 in combination with additional masks of the source and drain electrodes 313 and 314. Further, it is difficult to control the reflow of the residual resist masks 338 in the remaining directions due to the absence of any re-flow restrictor such as the step-like barrier walls 317-a and 371b. It is difficult to control the pattern shape of the reflow-deformed resist mask 348. This means it difficult to control the pattern shape of the island layer 324. The island layer 324 of amorphous silicon underlies the source and drain sides ohmic contact layers 310 and 311. The island layer 324 is thus electrically connected to the source and drain electrodes 313 and 314. A parasitic capacitance between the gate electrode 302 and the source and drain electrodes 313 and 314 depends on the pattern shape of the island layer 324. In order to precisely control the parasitic capacitance, it is essential to control the pattern shape of the reflow-deformed resist mask 348 or to control the pattern shape of the island layer 324.

In the above circumstances, the development of a novel improving a highly accurate control to a pattern shape of a reflow-deformed resist pattern free from the above problems is desirable.

SUMMARY OF THE INVENTION

Accordingly, it is an object of the present invention to provide a novel method of deforming a resist pattern to be used for forming a semiconductor device free from the above problems.

It is a further object of the present invention to provide a novel method of improving the accuracy in the quantity of deformation of an original resist pattern.

It is a still further object of the present invention to provide a novel method improving a highly accurate control to a pattern shape of a reflow-deformed resist pattern.

It is yet a further object of the present invention to provide a novel method of patterning a layer by use of a deformed resist pattern from an original resist pattern.

It is yet a further object of the present invention to provide a novel method of forming a semiconductor device by use of both original and deformed resist patterns in different processes.

It is a further primary object of the present invention to provide a semiconductor device formed by utilizing a novel method of deforming a resist pattern.

It is another object of the present invention to provide a semiconductor device formed by utilizing a novel method of improving the accuracy in the quantity of deformation of an original resist pattern.

It is still another object of the present invention to provide a semiconductor device formed by utilizing a novel method improving a highly accurate control to a pattern shape of a reflow-deformed resist pattern.

It is yet another object of the present invention to provide a semiconductor device formed by utilizing a novel method of patterning a layer by use of a deformed resist pattern from an original resist pattern.

It is further another object of the present invention to provide a semiconductor device formed by utilizing a novel method of forming a semiconductor device by use of both original and deformed resist patterns in different processes.

The present invention provides a method of deforming a pattern comprising the steps of: forming, over a substrate, a layered-structure with an upper surface including at least one selected region and at least a re-flow stopper groove, wherein the re-flow stopper groove extends outside the selected region and separate from the selected region; selectively forming at least one pattern on the selected region; and causing a re-flow of the pattern, wherein a part of an outwardly re-flowed pattern is flowed into the re-flow stopper groove, and then an outward re-flow of the pattern is restricted by the re-flow stopper groove extending outside of the pattern, thereby to form a deformed pattern with at least an outside edge part defined by an outside edge of the re-flow stopper groove.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1A:
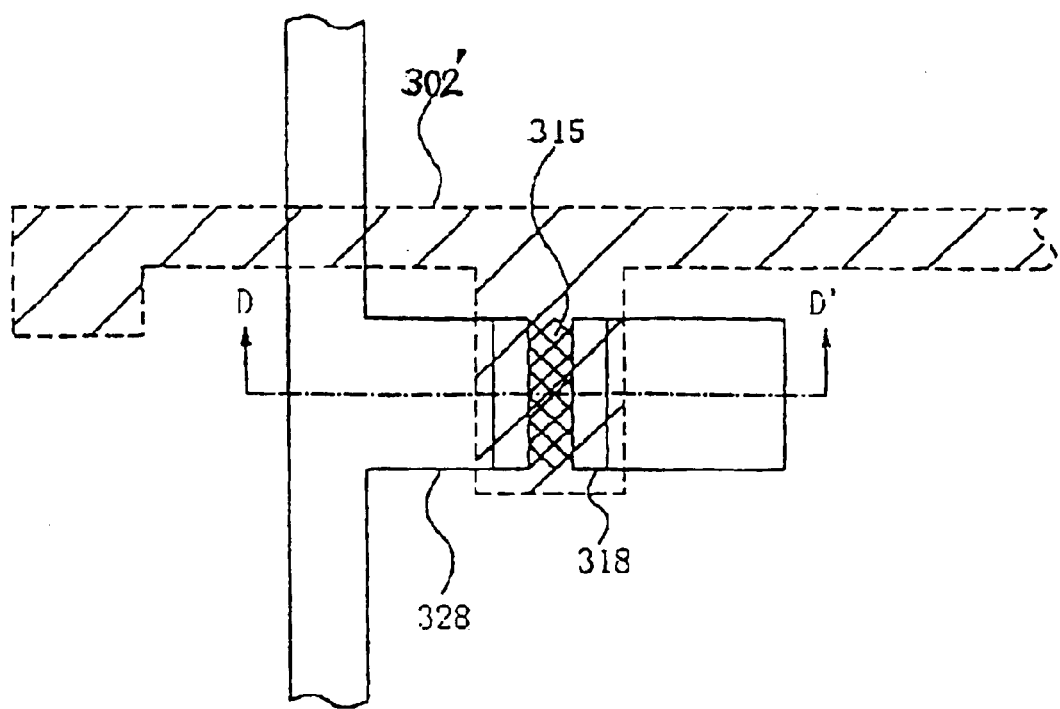
FIG. 1A is a fragmentary plan view of a thin film transistor of a first step involved in conventional sequential fabrication processes.
Figure 1B:
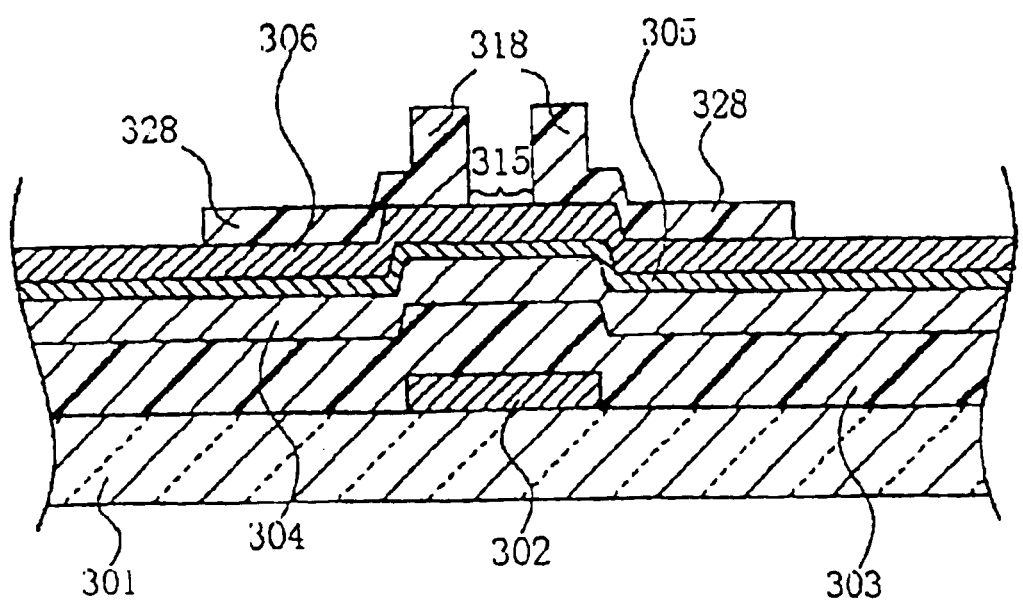
FIG. 1B is a fragmentary cross sectional elevation view of a thin film transistor shown in FIG. 1A, taken along a D–D' line.
Figure 2A:
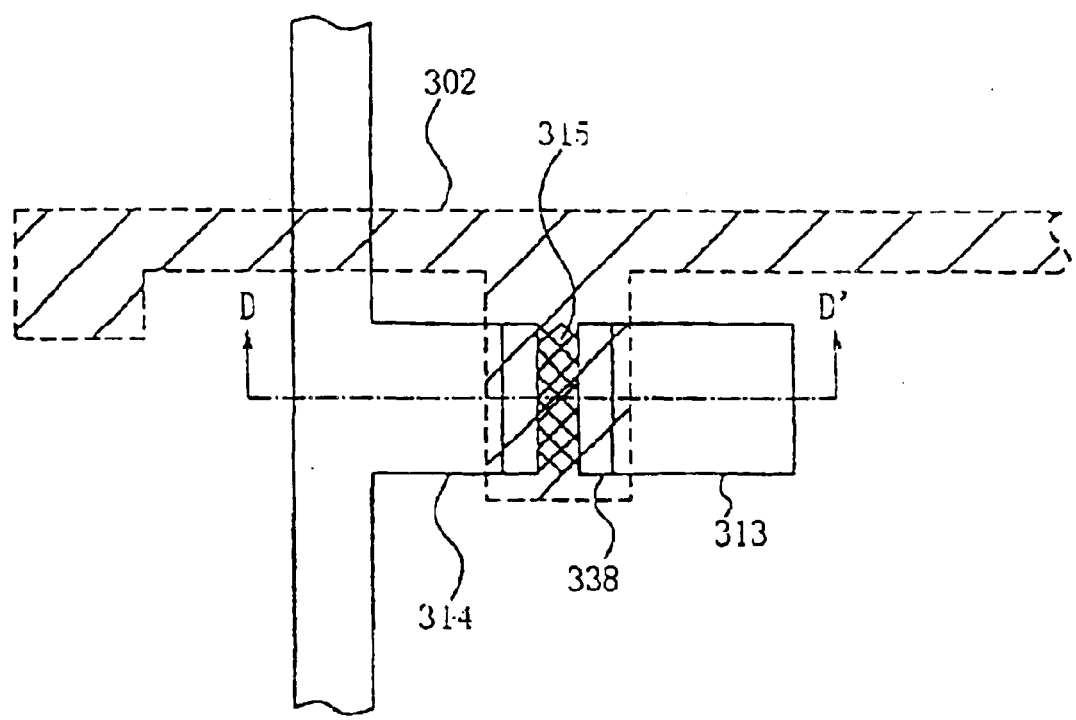
FIG. 2A is a fragmentary plan view of a thin film transistor of a second step involved in conventional sequential fabrication processes.
Figure 2B:
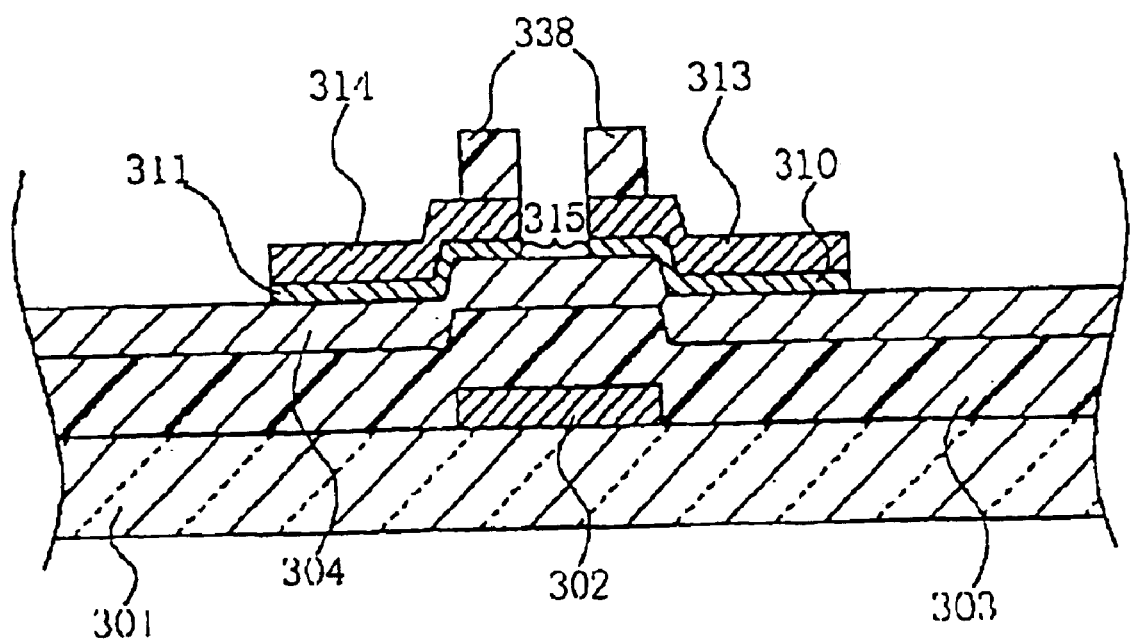
FIG. 2B is a fragmentary cross sectional elevation view of a thin film transistor shown in FIG. 2A, taken along a D–D' line.
Figure 3A:
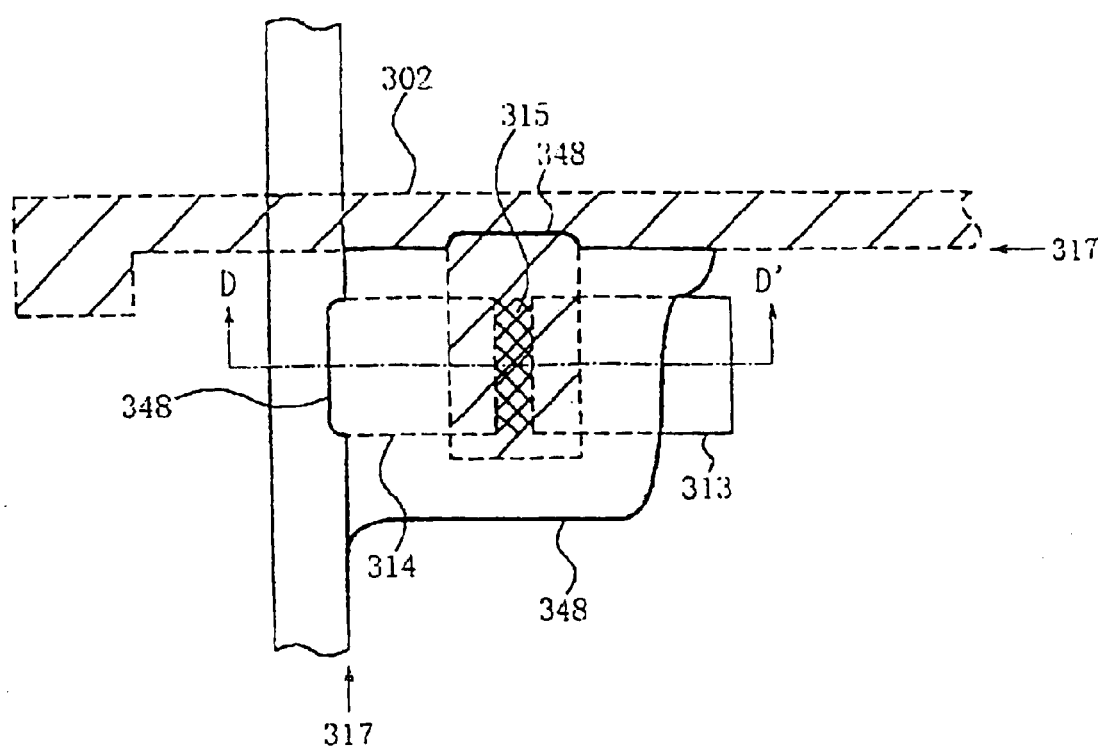
FIG. 3A is a fragmentary plan view of a thin film transistor of a third step involved in conventional sequential fabrication processes.
Figure 3B:
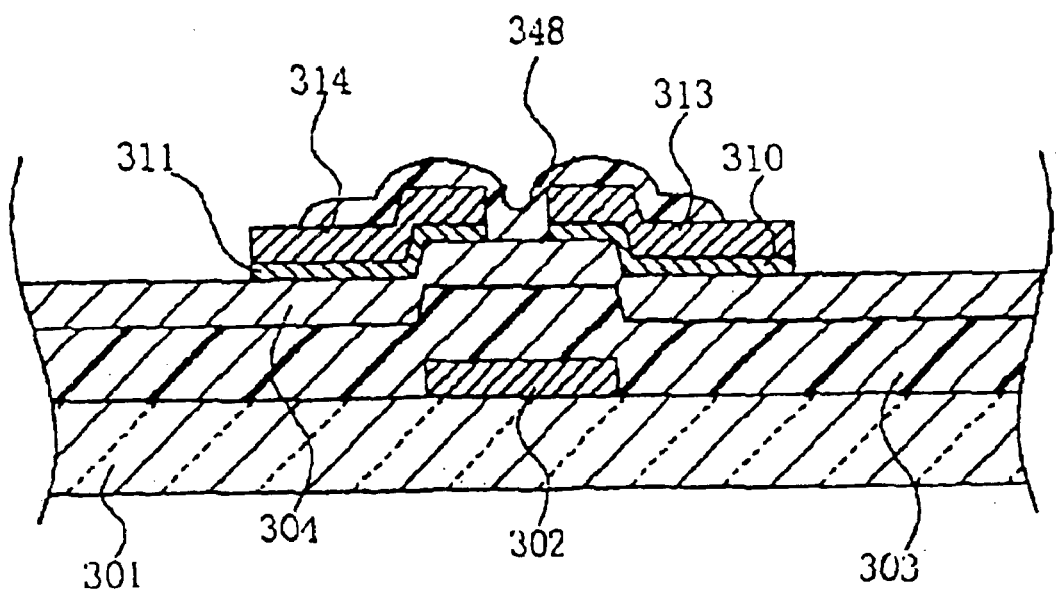
FIG. 3B is a fragmentary cross sectional elevation view of a thin film transistor shown in FIG. 3A, taken along a D–D' line.
Figure 4A:
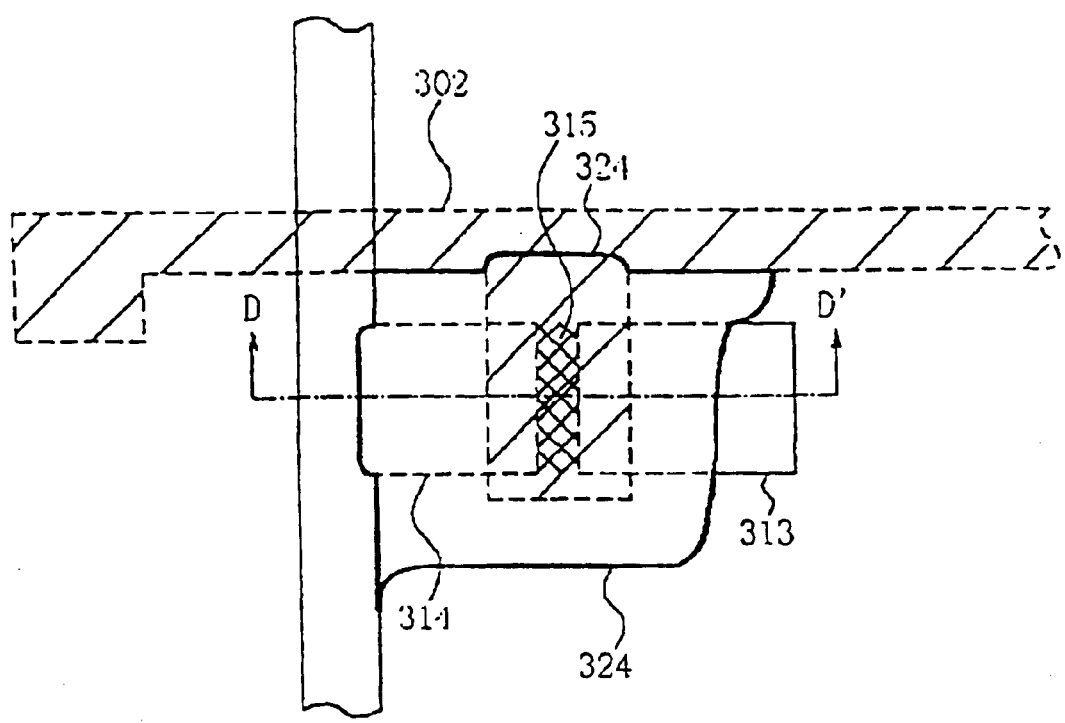
FIG. 4A is a fragmentary plan view of a thin film transistor of a fourth step involved in conventional sequential fabrication processes.
Figure 4B:
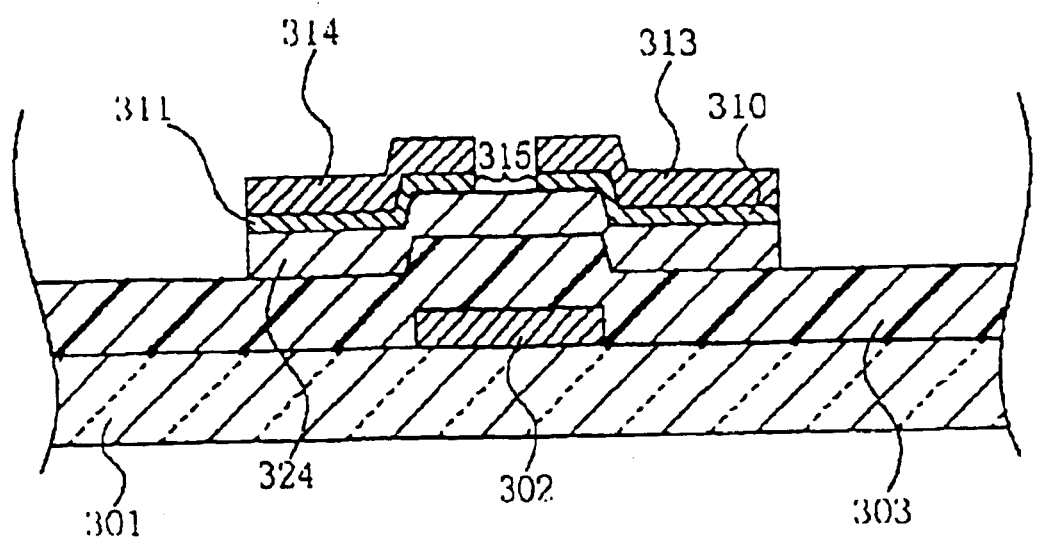
FIG. 4B is a fragmentary cross sectional elevation view of a thin film transistor shown in FIG. 4A, taken along a D–D' line.

A first aspect of the present invention is a method of deforming a pattern. The method comprises the steps of: forming, over a substrate, a layered-structure with an upper surface including at least one selected region and at least a re-flow stopper groove, wherein the re-flow stopper groove extends outside the selected region and separate from the selected region; selectively forming at least one pattern on the selected region; and causing a re-flow of the pattern, wherein a part of an outwardly re-flowed pattern is flowed into the re-flow stopper groove, and then an outward re-flow of the pattern is restricted by the re-flow stopper groove extending outside of the pattern, thereby to form a deformed pattern with at least an outside edge part defined by an outside edge of the re-flow stopper groove.

It is preferable that the re-flow stopper groove excludes a channel region, and parts of the outwardly re-flowed pattern are flowed into both the re-flow stopper groove and the channel region.

It is further preferable that the re-flow stopper groove is separate from the channel region.

It is further more preferable that the re-flow stopper groove is positioned indirectly over a gap between a gate electrode and at least a dummy gate electrode.

It is also preferable that the re-flow stopper groove comprises a recessed trench groove formed in the layered-structure.

It is also preferable that the re-flow stopper groove comprises a first gap between a source electrode and a dummy source electrode and a second gap between a drain electrode and a dummy drain electrode.

It is also preferable that the re-flow stopper groove is adjacent to the channel region.

It is further preferable that the re-flow stopper groove is positioned indirectly over a gap between a gate electrode and at least a dummy gate electrode.

It is further preferable that the re-flow stopper groove is defined by both a side wall of an extending layer from one of source and drain electrodes and a stepped portion of the channel region, where the stepped portion is positioned indirectly over an edge of a gate electrode.

It is also preferable that the re-flow stopper groove includes a channel region, and a part of the outwardly re-flowed pattern is flowed into the re-flow stopper groove.

It is further preferable that the re-flow stopper groove and the channel region are in forms of annular shape, and an outside peripheral edge of the re-flow stopper groove encompasses an outside peripheral edge of the channel region, and the outside peripheral edge of the re-flow stopper groove is defined by stepped portions of source and drain electrodes, where the stepped portions of the source and drain electrodes are positioned indirectly over a stepped portion of a gate electrode, and where the stepped portion of the gate electrode extends in a form of annular shape and defines a depressed region of the gate electrode.

It is also preferable that the re-flow stopper groove is included in a channel region which extends outside the selected region, and a part of the outwardly re-flowed pattern is flowed into the channel region.

It is further preferable that the re-flow stopper groove is positioned indirectly over a groove of a gate electrode.

It is also preferable that the re-flow stopper groove just overlaps a channel region which extends outside the selected region, and a part of the outwardly re-flowed pattern is flowed into the re-flow stopper groove.

It is also preferable that the re-flow stopper groove and the channel region are an annular shaped region which is defined by an island-shaped electrode and an annular-shaped electrode which surrounds the island-shaped electrode completely.

It is also preferable that the re-flow stopper groove surrounds the selected region completely.

It is also preferable that the re-flow stopper groove surrounds the selected region incompletely.

It is also preferable that the selected region comprises a set of plural selected regions separate from each other and adjacent to each other, and the re-flow stopper groove surrounds the set of plural selected regions completely.

It is also preferable that the selected region comprises a set of plural selected regions separate from each other and adjacent to each other, and the re-flow stopper groove surrounds the set of plural selected regions incompletely.

It is also preferable that the pattern is a pattern containing an organic material.

It is further preferable that the pattern is a resist pattern.

A second aspect of the present invention is a method of forming a re-flowed pattern over a layered-structure. The method comprises the steps of: forming an original resist pattern over a layered-structure with an upper surface including at least one selected region and at least a re-flow stopper groove wherein extends outside the selected region and separate from the selected region, and the original resist pattern comprising a thicker portion and a thinner portion, and the thicker portion extending on a selected region, patterning a layered-structure by use of the original resist pattern; removing the thinner portion and reducing a thickness of the thicker portion to form a residual resist pattern unchanged in pattern shape from the thicker portion; and causing a re-flow of the residual pattern, wherein a part of an outwardly re-flowed pattern is flowed into the re-flow stopper groove, and then an outward re-flow of the pattern is restricted by the re-flow stopper groove extending outside of the pattern, thereby to form a deformed pattern with at least an outside edge part defined by an outside edge of the re-flow stopper groove.

A third aspect of the present invention is a method of patterning a layered-structure. The method comprises the steps of: forming an original resist pattern over a layered-structure with an upper surface including at least one selected region and at least a re-flow stopper groove wherein extends outside the selected region and separate from the selected region, and the original resist pattern comprising a thicker portion and a thinner portion, and the thicker portion extending on a selected region, patterning a layered-structure by use of the original resist pattern; removing the thinner portion and reducing a thickness of the thicker portion to form a residual resist pattern unchanged in pattern shape from the thicker portion; and causing a re-flow of the residual pattern, wherein a part of an outwardly re-flowed pattern is flowed into the re-flow stopper groove, and then an outward re-flow of the pattern is restricted by the re-flow stopper groove extending outside of the pattern, thereby to form a deformed pattern with at least an outside edge part defined by an outside edge of the re-flow stopper groove; and patterning the layered-structure by use of the deformed pattern.

A fourth aspect of the present invention is a semiconductor device including gate, source and drain electrodes, a layered structure over a substrate, and the layered structure has a surface which further has at least a groove, wherein the groove extends outside at least a selected region on the layered-structure, and the selected region being adjacent to a channel region, and the groove extends outside of the gate electrode, and the groove is separate by a gap from the gate electrode.

It is preferable that the groove surrounds the gate electrode incompletely.

It is also preferable that the groove surrounds the gate electrode completely.

It is further preferable that the groove extends in an annular form.

A fifth aspect of the present invention is a semiconductor device including gate, source and drain electrodes, a layered structure over a substrate, and at least a groove formed in the layered structure, wherein the groove extends outside at least a selected region on the layered-structure, and the selected region being adjacent to a channel region, and the groove extends outside of the gate electrode, and the groove is separate by a gap from the gate electrode.

It is also preferable that the groove surrounds the gate electrode incompletely.

It is also preferable that the groove surrounds the gate electrode completely.

It is also preferable that the groove extends in an annular form.

A sixth aspect of the present invention is a semiconductor device including a gate electrode and a layered-structure, wherein the gate electrode has at least a step, and an upper surface of the layered-structure also has at least a step which is positioned over the step of the gate electrode.

It is also preferable that the gate has a thickness-reduced region bounded by the step.

A seventh aspect of the present invention is a semiconductor device including a gate electrode structure which further comprises at least a gate electrode and at least a dummy gate electrode, wherein the dummy gate electrode is separate by a gap from the gate electrode and positioned outside of the gate electrode.

It is also preferable that the dummy gate electrode surrounds the gate electrode incompletely.

It is also preferable that the dummy gate electrode surrounds the gate electrode completely.

It is also preferable that the dummy gate electrode extends in an annular form.

It is also preferable that the dummy gate electrode extends adjacent to and parallel to a flat side of the gate electrode.

It is also preferable that the semiconductor device further includes a multi-layer structure comprising plural laminated layers which extend over the gate electrode structure, and surfaces of the plural laminated layers have grooves which are positioned over the gap.

An eighth aspect of the present invention is a semiconductor device including gate, source and drain electrodes, a layered structure over a substrate, and at least a groove in the layered structure, wherein the groove extends outside at least a selected region on the layered-structure, and the selected region being adjacent to a channel region, and the groove extends outside of the gate electrode, and the groove is separate by a gap from the gate electrode, and wherein at least a part of the source and drain electrodes is present in the groove.

It is also preferable that the groove surrounds the gate electrode incompletely.

It is also preferable that the groove surrounds the gate electrode completely.

It is also preferable that the groove extends in an annular form.

It is also preferable that the groove extends adjacent to and parallel to a flat side of the gate electrode.

A ninth aspect of the present invention is a semiconductor device including gate, source and drain electrodes, dummy source and drain electrodes, a layered structure over a substrate, and at least a groove, wherein the dummy source and drain electrodes are positioned outside the source and drain electrodes, and the groove separates the source and drain electrodes from the dummy source and drain electrodes, and wherein the groove extends outside at least a selected region on the layered-structure, and the selected region being adjacent to a channel region, and the groove extends outside of the gate electrode in plan view, and the groove is separate from the gate electrode in plan view.

It is also preferable that the groove surrounds the gate electrode incompletely.

It is also preferable that the groove surrounds the gate electrode completely.

It is also preferable that the groove extends in an annular form.

It is also preferable that the groove extends adjacent to and parallel to a flat side of the gate electrode.

A tenth aspect of the present invention is a semiconductor device including gate, source and drain electrodes, a channel region, and at least a groove, wherein first one of the source and drain electrodes includes an island portion, and second one of the source and drain electrodes includes a surrounding portion which surrounds the channel region, and the channel region further surrounds the island portion, and the surrounding portion is separate by the channel region from the island portion, and wherein the groove includes the channel region.

It is also preferable that the surrounding portion surrounds the island portion incompletely.

It is also preferable that the groove further includes an additional groove which extends adjacent to an opening side of the surrounding portion.

It is also preferable to further comprise a dummy gate electrode separate by a gap from the gate electrode, wherein the additional groove is positioned over the gap.

It is also preferable that the first one further includes a connecting portion, and an additional extending portion which extends adjacent to an opening side of the surrounding portion and which faces to the opening side, and the additional extending portion is connected through the connecting portion to the island portion.

It is also preferable that the connecting portion has a step-like wall.

It is also preferable that the surrounding portion surrounds the island portion completely.

It is also preferable that the groove extends in an annular form.

An eleventh aspect of the present invention is a semiconductor device including a layered-structure over a substrate, wherein an upper surface of the substrate has at least a groove, and an upper surface of the layered-structure also has at least a groove which is positioned over the groove of the substrate, and wherein the groove of the substrate selectively extends adjacent to a channel region.

It is also preferable that the groove of the substrate extends around the channel region in plan view.

It is also preferable that the groove of the substrate surrounds completely.

It is also preferable that the groove of the substrate surrounds incompletely.

A twelfth aspect of the present invention is a semiconductor device including a layered-structure over a substrate, wherein an upper surface of the substrate has at least a level-down region, and an upper surface of the layered-structure also has at least a groove which extends over the level-down region of the substrate, and wherein the level-down region of the substrate selectively extends including a channel region in plan view.

First Embodiment

Figure 5A:
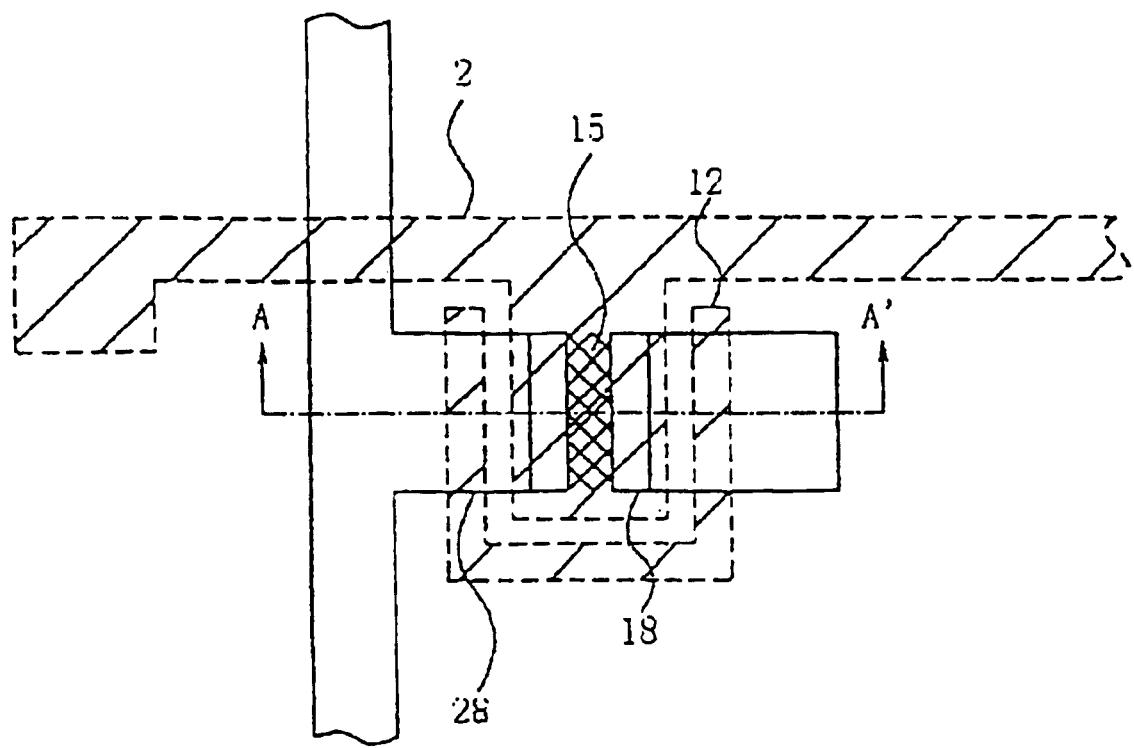
FIG. 5A is a fragmentary plan view of a thin film transistor of a first step involved in novel sequential fabrication processes in a first embodiment in accordance with the present invention.
Figure 5B:
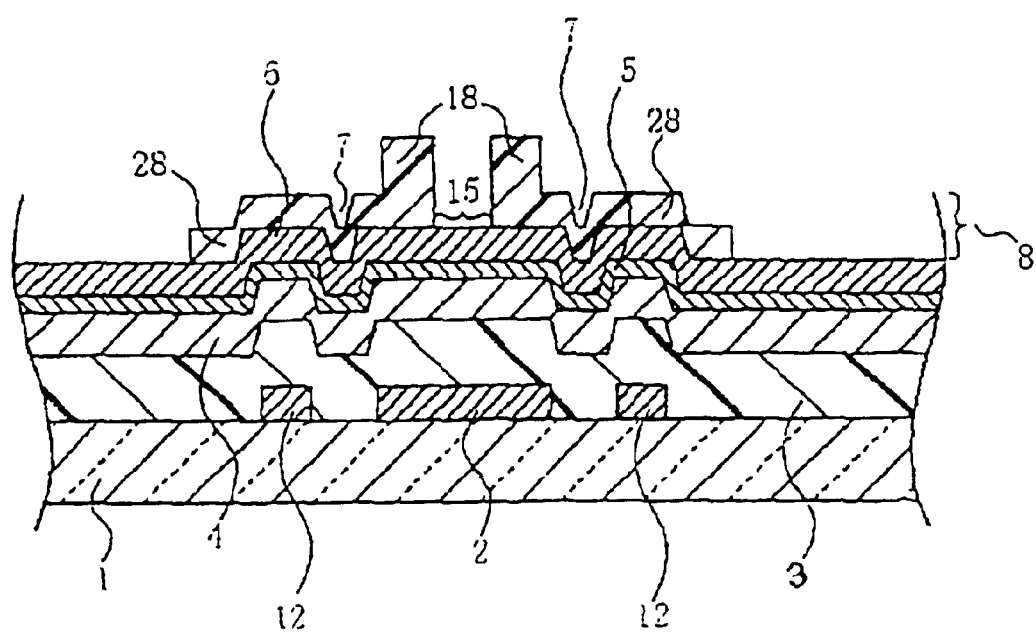
FIG. 5B is a fragmentary cross sectional elevation view of a thin film transistor shown in FIG. 5A, taken along an A–A' line.
Figure 6A:
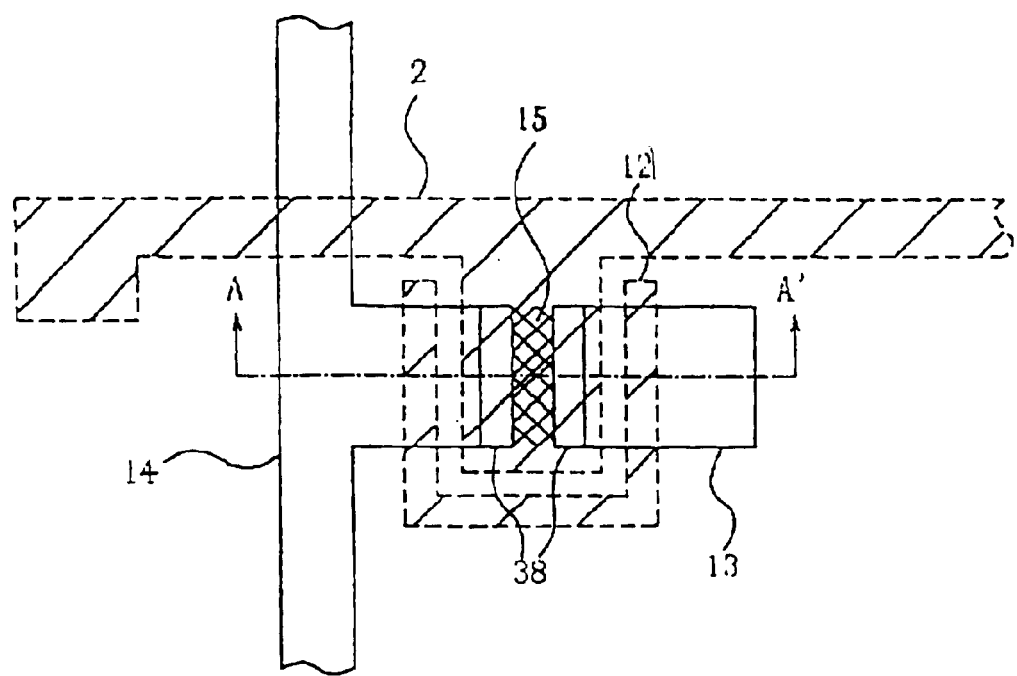
FIG. 6A is a fragmentary plan view of a thin film transistor of a second step involved in novel sequential fabrication processes in a first embodiment in accordance with the present invention.
Figure 6B:
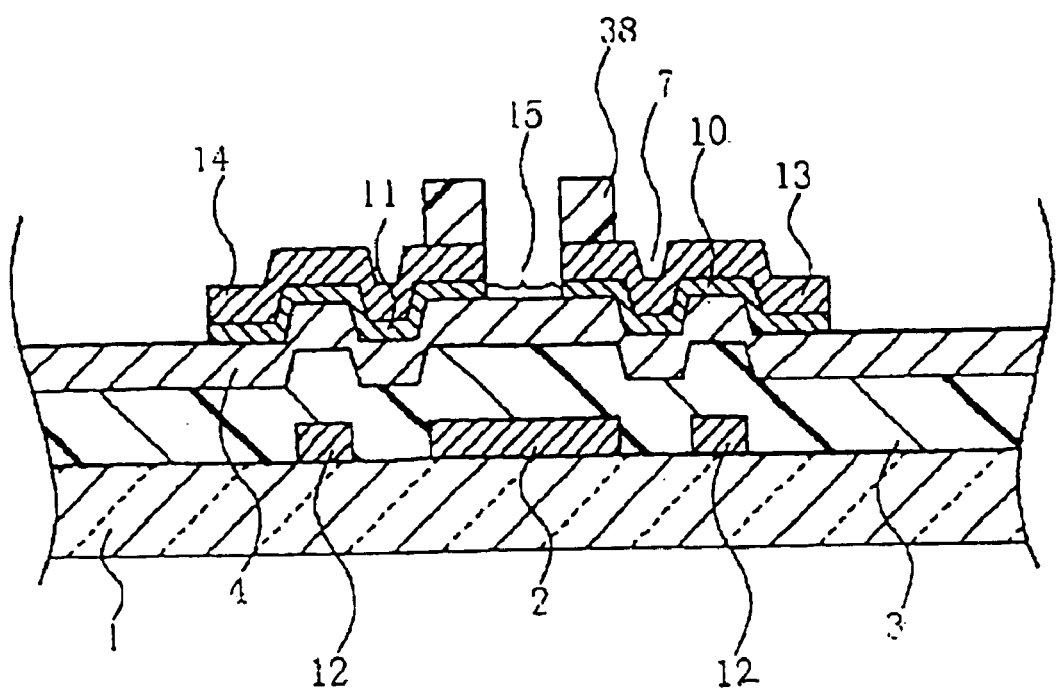
FIG. 6B is a fragmentary cross sectional elevation view of a thin film transistor shown in FIG. 6A, taken along an A–A' line.
Figure 7A:
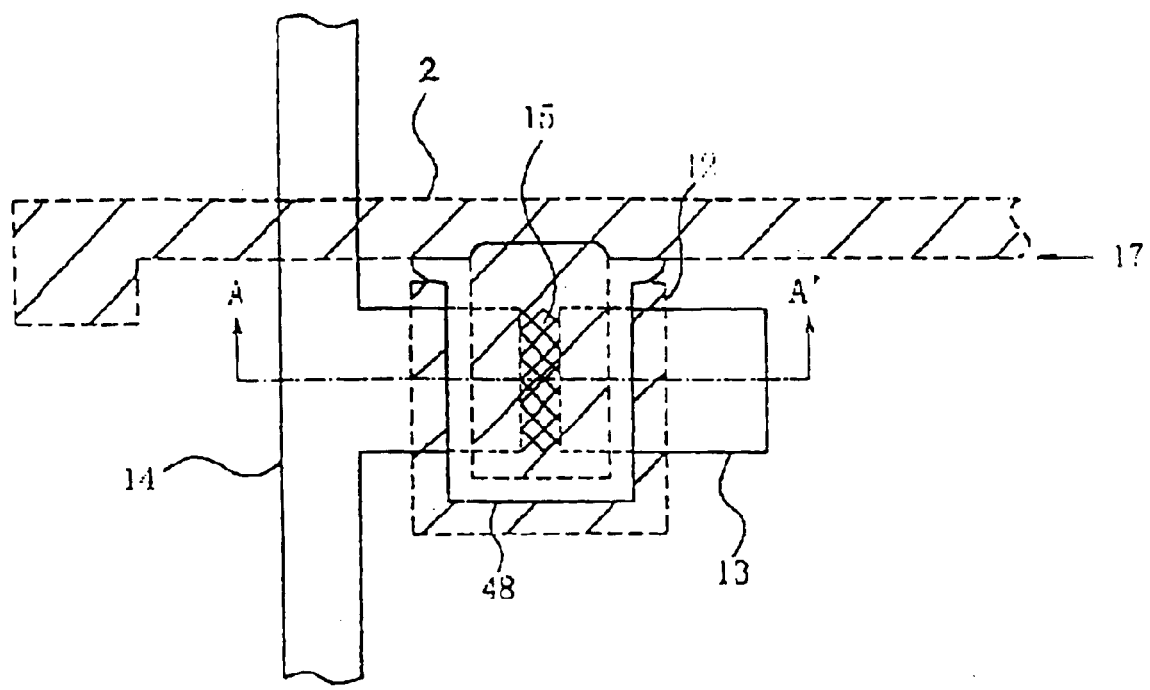
FIG. 7A is a fragmentary plan view of a thin film transistor of a third step involved in novel sequential fabrication processes in a first embodiment in accordance with the present invention.
Figure 7B:
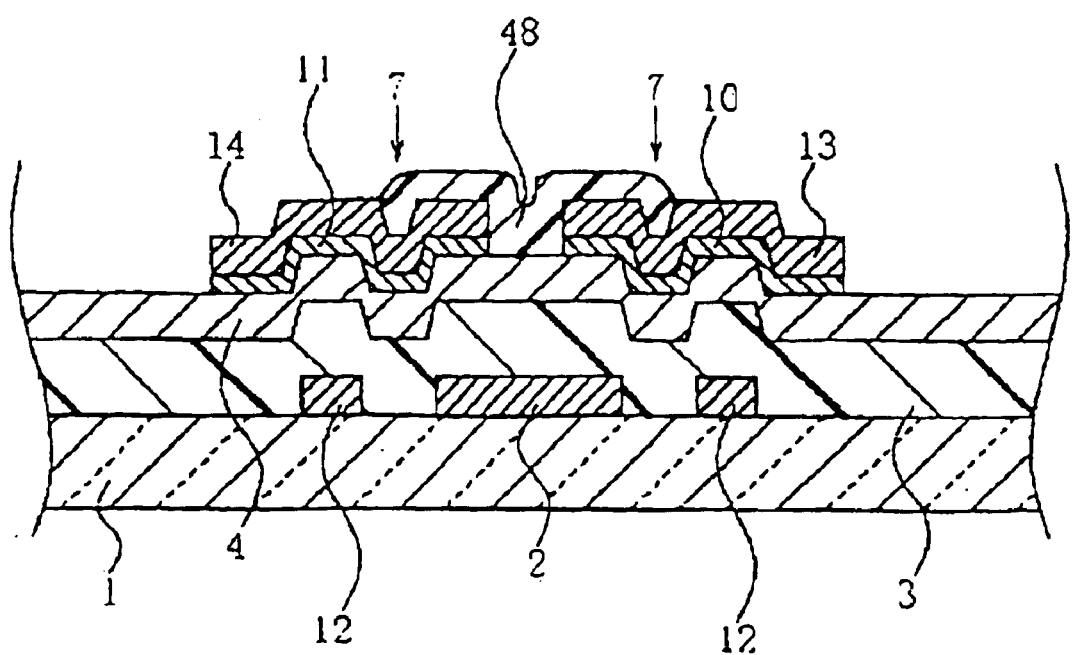
FIG. 7B is a fragmentary cross sectional elevation view of a thin film transistor shown in FIG. 7A, taken along an A–A' line.
Figure 8A:
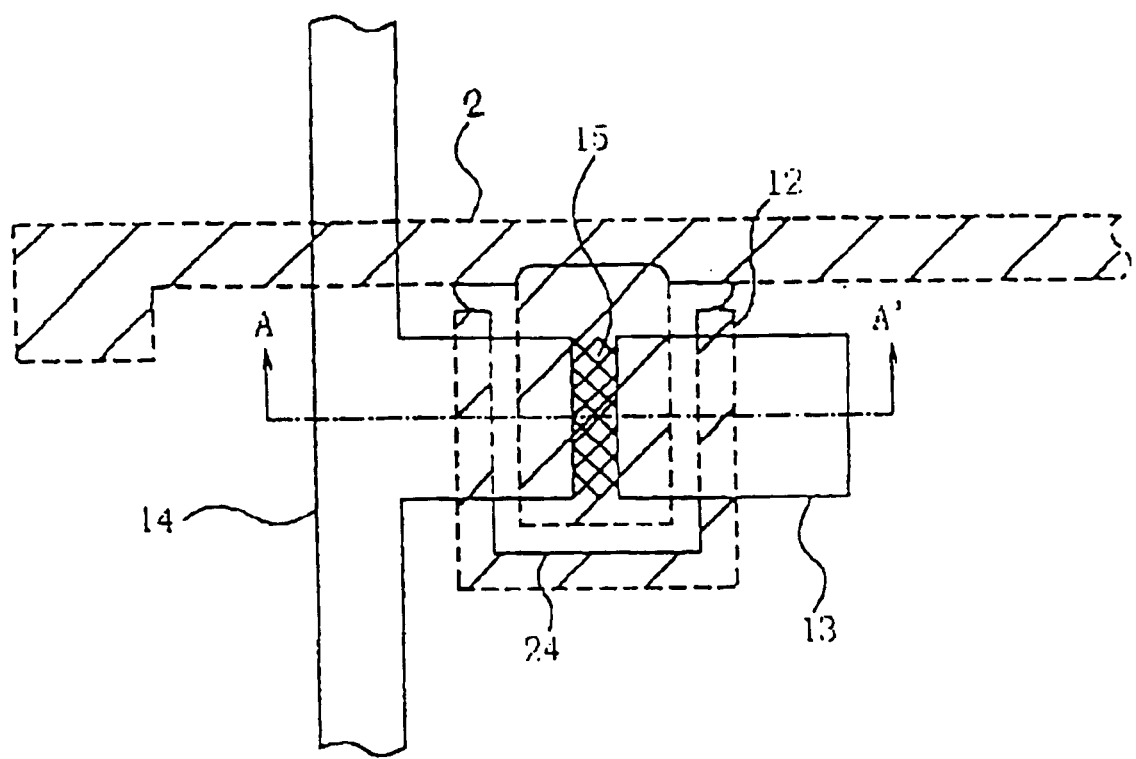
FIG. 8A is a fragmentary plan view of a thin film transistor of a fourth step involved in novel sequential fabrication processes in a first embodiment in accordance with the present invention.
Figure 8B:
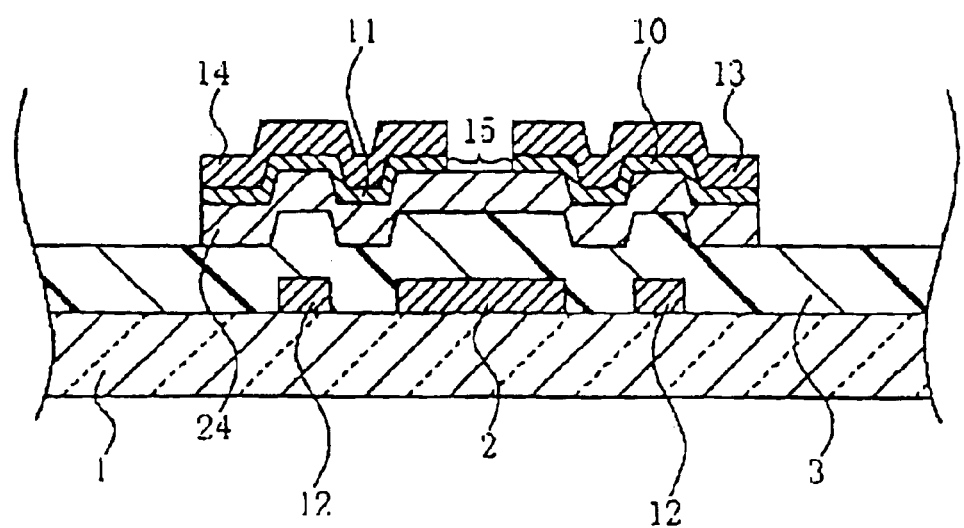
FIG. 8B is a fragmentary cross sectional elevation view of a thin film transistor shown in FIG. 8A, taken along an A–A' line.

A first embodiment according to the present invention will be described in detail with reference to the drawings. FIG. 5A is a fragmentary plan view of a thin film transistor of a first step involved in novel sequential fabrication processes in a first embodiment in accordance with the present invention. FIG. 5B is a fragmentary cross sectional elevation view of a thin film transistor shown in FIG. 5A, taken along an A–A' line. FIG. 6A is a fragmentary plan view of a thin film transistor of a second step involved in novel sequential fabrication processes in a first embodiment in accordance with the present invention. FIG. 6B is a fragmentary cross sectional elevation view of a thin film transistor shown in FIG. 6A, taken along an A–A' line. FIG. 7A is a fragmentary plan view of a thin film transistor of a third step involved in novel sequential fabrication processes in a first embodiment in accordance with the present invention. FIG. 7B is a fragmentary cross sectional elevation view of a thin film transistor shown in FIG. 7A, taken along an A–A' line. FIG. 8A is a fragmentary plan view of a thin film transistor of a fourth step involved in novel sequential fabrication processes in a first embodiment in accordance with the present invention. FIG. 8B is a fragmentary cross sectional elevation view of a thin film transistor shown in FIG. 8A, taken along an A–A' line. A thin film transistor is formed over an insulating substrate 1.

With reference to FIGS. 5A and 5B, a bottom conductive film is formed over a top surface of the insulating substrate 1. The bottom conductive film is patterned to form a gate electrode interconnection 2 and a dummy gate electrode 12. The gate electrode interconnection 2 has a gate electrode 2 which has a rectangle shape in plan view. The gate electrode 2 extends from the gate electrode interconnection 2 in a direction perpendicular to a longitudinal direction of the gate electrode interconnection 2. The dummy gate electrode 12 is generally U-shaped, so that the dummy gate electrode 12 surrounds the rectangle-shaped gate electrode 2. The dummy gate electrode 12 is separate from the gate electrode 2 and from the gate electrode interconnection 2. One side of the gate electrode 2 is bounded with the gate electrode interconnection 2. The dummy gate electrode 12 extends along the remaining three sides of the gate electrode 2. An U-shaped gap is defined between inside edges of the dummy gate electrode 12 and the remaining three sides of the gate electrode 2. The U-shaped gap has an uniform width and is formed between the gate electrode 2 and the dummy gate electrode 12.

A gate insulating film 3 having a thickness of 3500 nanometers is formed over the insulating substrate 1 and the gate electrode interconnection 2, the gate electrode 2 and the dummy gate electrode 12, wherein the gate insulating film 3 fills the U-shaped gap between inside edges of the dummy gate electrode 12 and the remaining three sides of the gate electrode 2. An upper surface of the gate insulating film 3 has a groove which extends in a form of generally U-shape in plan view. The groove extends over the U-shaped gap between the gate electrode 2 and the dummy gate electrode 12. The groove in the upper surface of the gate insulating film 3 is thus formed by the U-shaped gap between the gate electrode 2 and the dummy gate electrode 12.

An amorphous silicon film 4 having a thickness of 200 nanometers is formed over the upper surface of the gate insulating film 3. An upper surface of the amorphous silicon film 4 also has a groove which extends in a form of generally U-shape in plan view. The groove extends over the U-shaped groove in the upper surface of the gate insulating film 3.

An n+-type amorphous silicon film 5 having a thickness of 50 nanometers is formed over the upper surface of the amorphous silicon film 4. An upper surface of the n+-type amorphous silicon film 5 also has a groove which extends in a form of generally U-shape in plan view. The groove extends over the U-shaped groove in the upper surface of the amorphous silicon film 4.

A top conductive film 6 is formed over the upper surface of the n+-type amorphous silicon film 5. An upper surface of the top conductive film 6 also has a reflow stopper groove 7 which extends in a form of generally U-shape in plan view. The reflow stopper groove 7 extends over the U-shaped groove in the upper surface of the n+-type amorphous silicon film 5. The reflow stopper groove 7 is positioned indirectly over the U-shaped gap between the gate electrode 2 and the dummy gate electrode 12.

A resist mask 8 is selectively formed over the upper surface of the top conductive film 6 by use of a lithography technique. The resist mask 8 comprises a thick resist mask 18 and a thin resist mask 28. The thick resist mask 18 is positioned in selected regions adjacent to a channel region 15 which has a rectangle shape. The selected regions also have rectangle shape regions along opposite outsides of the rectangle shape channel region 15. The thick resist mask 18 may have a thickness of about 3 micrometers. The thin resist mask 28 may have a thickness of about 0.2–0.7 micrometers.

With reference to FIGS. 6A and 6B, a first etching process is carried out by use of the thick and thin resist masks 18 and 28 for selectively etching the top conductive film 6 and the n+-type amorphous silicon film 5. The top conductive film 6 may comprise a metal film. The top conductive film 6 may selectively be etched by a wet etching process to form source and drain electrodes 13 and 14. The n+-type amorphous silicon film 5 may also selectively be etched by a dry etching process under a pressure of 10 Pa, at a power of 1000 W for 60 seconds, wherein source gas flow rate ratios of $SF_6$/HCl/He are 100/100/150 sccm to form ohmic contact layers 10 and 11 which underlie the source and drain electrodes 13 and 14, thereby making ohmic contacts between the amorphous silicon film 4 and the source and drain electrodes 13 and 14.

Subsequently, a plasma ashing process is carried out in the presence of plasma atmosphere with oxygen flow rate at 400 sccm under a pressure of 20 Pa, and an RF power of 1000 W for 120 seconds. This plasma ashing process reduces the thickness of the resist mask 8, whereby the thin resist mask 28 is removed whilst the thick resist mask 18 is reduced in thickness, whereby the thickness-reduced resist mask 18 becomes a residual resist mask 38 which extends on the selected regions adjacent to the channel region 15.

With reference to FIGS. 7A and 7B, the residual resist mask 38 is then exposed to a steam of a solution which contains an organic solvent such as ethylcellsolveacetate (ECA) or N-methyl-2-pyrolidinone at 27° C. for 1–3 minutes. This exposure process causes the organic solvent to osmose into the residual resist mask 38, whereby the residual resist mask 38 is dissolved and re-flowed, and the residual resist mask 38 becomes a reflow-deformed resist mask 48.

A part of the re-flowed resist mask 48 is dropped into the channel region 15 and other parts of the re-flowed resist mask 48 are dropped into the reflow stopper groove 7 which extends in a form of the generally U-shape and positioned indirectly over the U-shaped gap between the gate electrode 2 and the dummy gate electrode 12. An inward reflow of the resist mask 48 is dropped into the channel region 15 and a further inward reflow of the resist mask 48 is restricted by the channel region 15. An outward reflow of the resist mask 48 is omnidirectional. The outward reflow of the resist mask 48 in one direction toward a step-like barrier wall 17 which extends indirectly over an edge of the gate electrode interconnection 2 is stopped or restricted by the step-like barrier wall 17. The remaining outward reflow of the resist mask 48 in the remaining three directions toward the reflow stopper groove 7 is dropped into the reflow stopper groove 7 and stopped or restricted by the reflow stopper groove 7. Each gap between ends of the reflow stopper groove 7 and the step-like barrier wall 17 is so narrow as substantially restricting a further outward reflow of the resist mask 48. An external shape or a circumferential shape of the reflow-deformed resist mask 48 provides a pattern shape. The external shape or a circumferential shape of the reflow-deformed resist mask 48 is defined by the step-like barrier wall 17 and outside edges of the reflow stopper groove 7. The step-like barrier wall 17 and the reflow stopper groove 7 enable a highly accurate control or definition to the pattern shape of the reflow-deformed resist mask 48. As long as the positions of the step-like barrier wall 17 and the reflow stopper groove 7 are highly accurate, the pattern shape of the reflow-deformed resist mask 48 is also highly accurate. Since the highly accurate positioning of the step-like barrier wall 17 and the reflow stopper groove 7 is relatively easy by use of the known techniques, it is also relatively easy to obtain the desired highly accurate control or definition to the pattern shape of the reflow-deformed resist mask 48.

With reference to FIGS. 8A and 8B, a second etching process is carried out by use of the deformed resist mask 48 in combination with the source and drain electrodes 13 and 14 as combined masks for selectively etching the amorphous silicon film 4, whereby the amorphous silicon film 4 becomes an island layer 24 which has a pattern shape which is defined by the deformed resist mask 48 in combination with the source and drain electrodes 13 and 14 as combined masks. The used deformed resist mask 48 is then removed, whereby a thin film transistor is formed.

The island layer 24 of amorphous silicon underlies the ohmic contact layers 10 and 11. The island layer 24 is thus electrically connected to the source and drain electrodes 13 and 14. A parasitic capacitance between the gate electrode 2 and the source and drain electrodes 13 and 14 depends on the pattern shape of the island layer 24. Since it is possible to obtain a highly accurate control or definition to the pattern shape of the reflow-deformed resist mask 48 or the pattern shape of the island layer 24, it is possible to obtain a highly accurate control to the parasitic capacitance.

In the above described embodiment, the reflow of the residual resist film 38 is caused by exposing the residual resist film 38 to the steam which contains the solution containing the organic solvent. Any other know methods for causing the re-flow of the resist mask are, of course, available. The re-flow may be caused by applying a heat to the resist mask.

The above novel method is further applicable to deformation to other pattern film than the resist mask, provided the pattern is allowed to be re-flowed by any available measures.

Figure 9A:
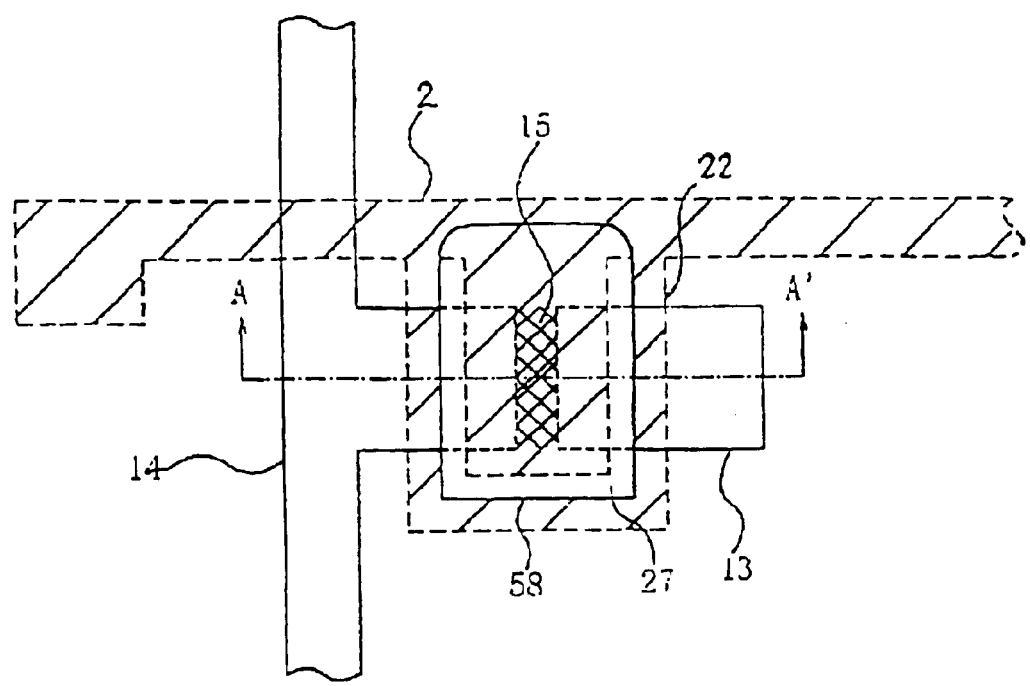
FIG. 9A is a fragmentary plan view of a thin film transistor of a third step involved in novel sequential fabrication processes in a first modification to the first embodiment in accordance with the present invention.
Figure 9B:
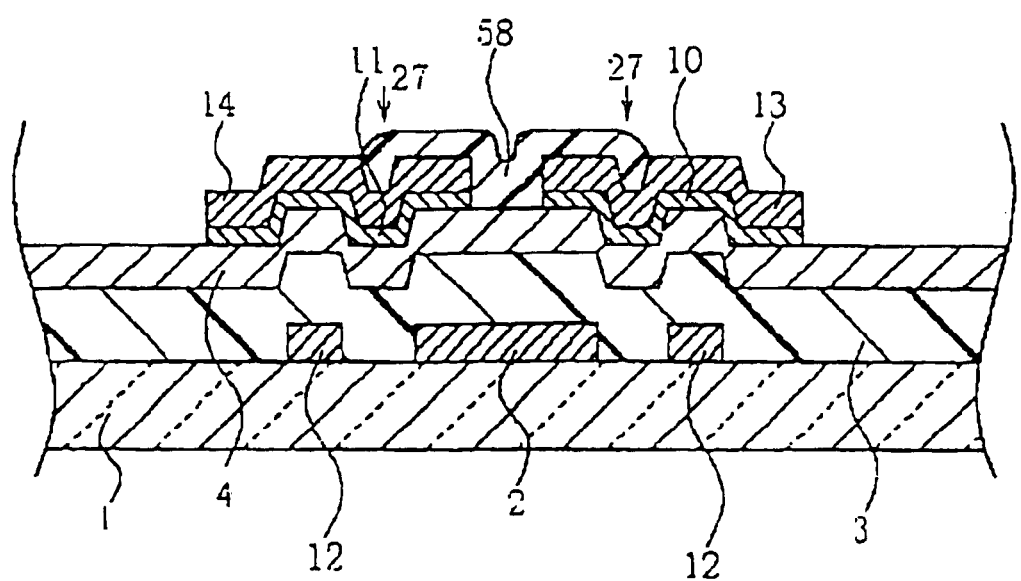
FIG. 9B is a fragmentary cross sectional elevation view of a thin film transistor shown in FIG. 9A, taken along an A–A' line.

The above described novel method of the first embodiment may be modified as follows. FIG. 9A is a fragmentary plan view of a thin film transistor of a third step involved in novel sequential fabrication processes in a first modification to the first embodiment in accordance with the present invention. FIG. 9B is a fragmentary cross sectional elevation view of a thin film transistor shown in FIG. 9A, taken along an A–A' line.

The following descriptions will focus on the difference of the first modified method from the above novel method of the first embodiment. In the above novel method of the first embodiment, the dummy gate electrode 12 is separate from the gate electrode interconnection 2. In this first modified method, a dummy gate electrode 22 is connected with the gate electrode interconnection 2.

The dummy gate electrode 22 is generally U-shaped, so that the dummy gate electrode 22 surrounds the rectangle-shaped gate electrode 2. The dummy gate electrode 12 is separate from the gate electrode 2 but connected with the gate electrode interconnection 2. One side of the gate electrode 2 is bounded with the gate electrode interconnection 2. The dummy gate electrode 22 extends along the remaining three sides of the gate electrode 2. An U-shaped gap is defined between inside edges of the dummy gate electrode 22 and the remaining three sides of the gate electrode 2. The U-shaped gap has an uniform width and is formed between the gate electrode 2 and the dummy gate electrode 22.

An upper surface of the top conductive film 6 also has a reflow stopper groove 27 which extends in a form of generally U-shape in plan view. The reflow stopper groove 27 extends over the U-shaped groove in the upper surface of the n+-type amorphous silicon film 5. The reflow stopper groove 27 is positioned indirectly over the U-shaped gap between the gate electrode 2 and the dummy gate electrode 22.

In the re-flow process, a part of the re-flowed resist mask 58 is dropped into the channel region 15 and other parts of the re-flowed resist mask 58 are dropped into the reflow stopper groove 27 which extends in a form of the generally U-shape and positioned indirectly over the U-shaped gap between the gate electrode 2 and the dummy gate electrode 22. An inward reflow of the resist mask 58 is dropped into the channel region 15 and a further inward reflow of the resist mask 58 is restricted by the channel region 15. An outward reflow of the resist mask 58 is omnidirectional. The outward reflow of the resist mask 58 in one direction toward a step-like barrier wall 17 which extends indirectly over an edge of the gate electrode interconnection 2 is stopped or restricted by the step-like barrier wall 17. The remaining outward reflow of the resist mask 58 in the remaining three directions toward the reflow stopper groove 7 is dropped into the reflow stopper groove 27 and stopped or restricted by the reflow stopper groove 27. No gap is formed between ends of the reflow stopper groove 7 and the step-like barrier wall 17, whereby complete restriction of a further outward reflow of the resist mask 58 is obtained. An external shape or a circumferential shape of the reflow-deformed resist mask 58 provides a pattern shape. The external shape or a circumferential shape of the reflow-deformed resist mask 58 is defined by the step-like barrier wall 17 and outside edges of the reflow stopper groove 27. The step-like barrier wall 17 and the reflow stopper groove 27 enable a highly accurate control or definition to the pattern shape of the reflow-deformed resist mask 58. As long as the positions of the step-like barrier wall 17 and the reflow stopper groove 27 are highly accurate, the pattern shape of the reflow-deformed resist mask 58 is also highly accurate. Since the highly accurate positioning of the step-like barrier wall 17 and the reflow stopper groove 27 is relatively easy by use of the known techniques, it is also relatively easy to obtain the desired highly accurate control or definition to the pattern shape of the reflow-deformed resist mask 58.

Second Embodiment

Figure 10A:
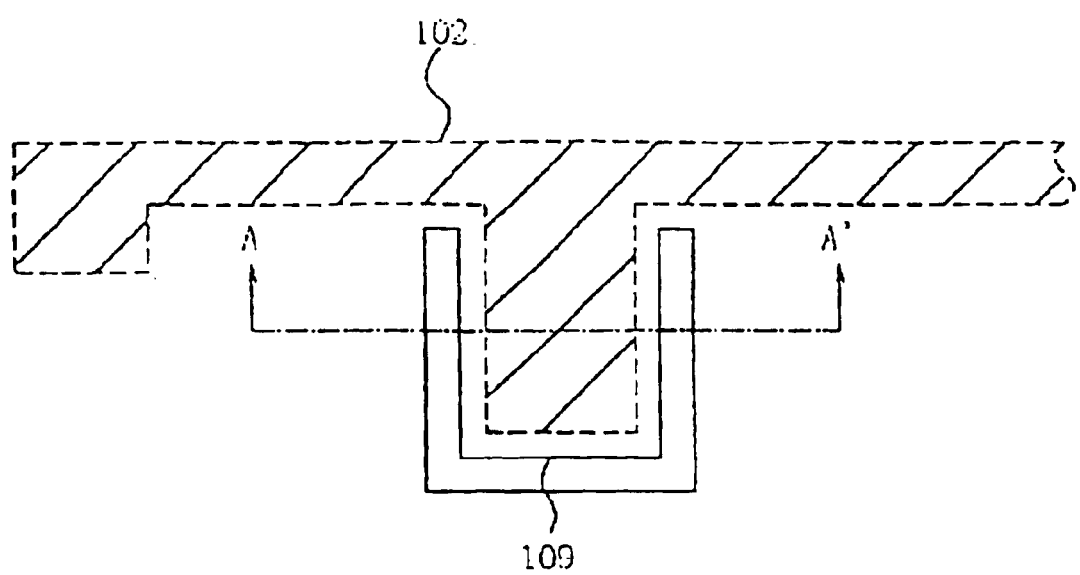
FIG. 10A is a fragmentary plan view of a thin film transistor of a first step involved in novel sequential fabrication processes in a second embodiment in accordance with the present invention.
Figure 10B:
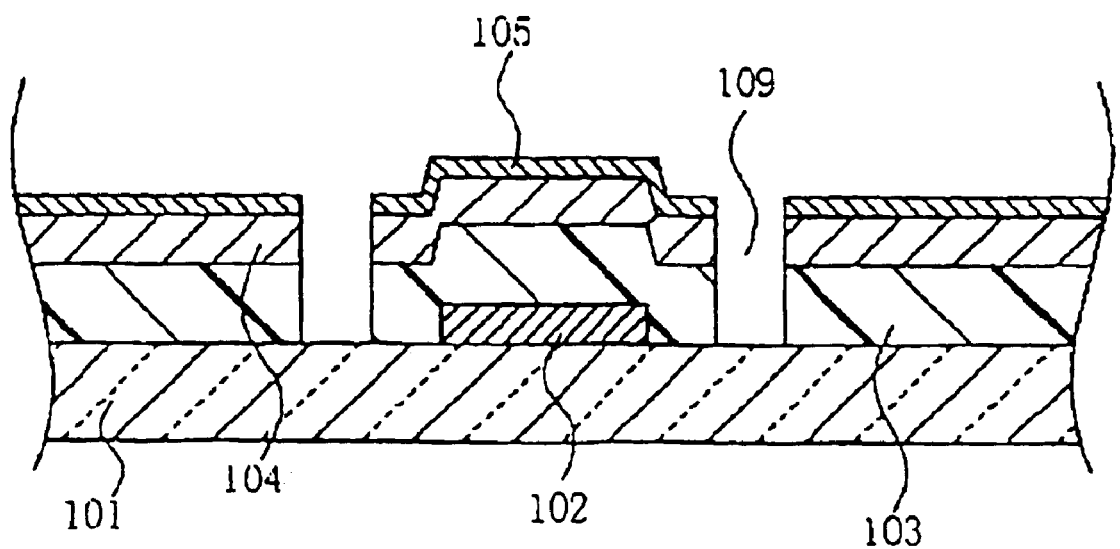
FIG. 10B is a fragmentary cross sectional elevation view of a thin film transistor shown in FIG. 10A, taken along an A–A' line.
Figure 11A:
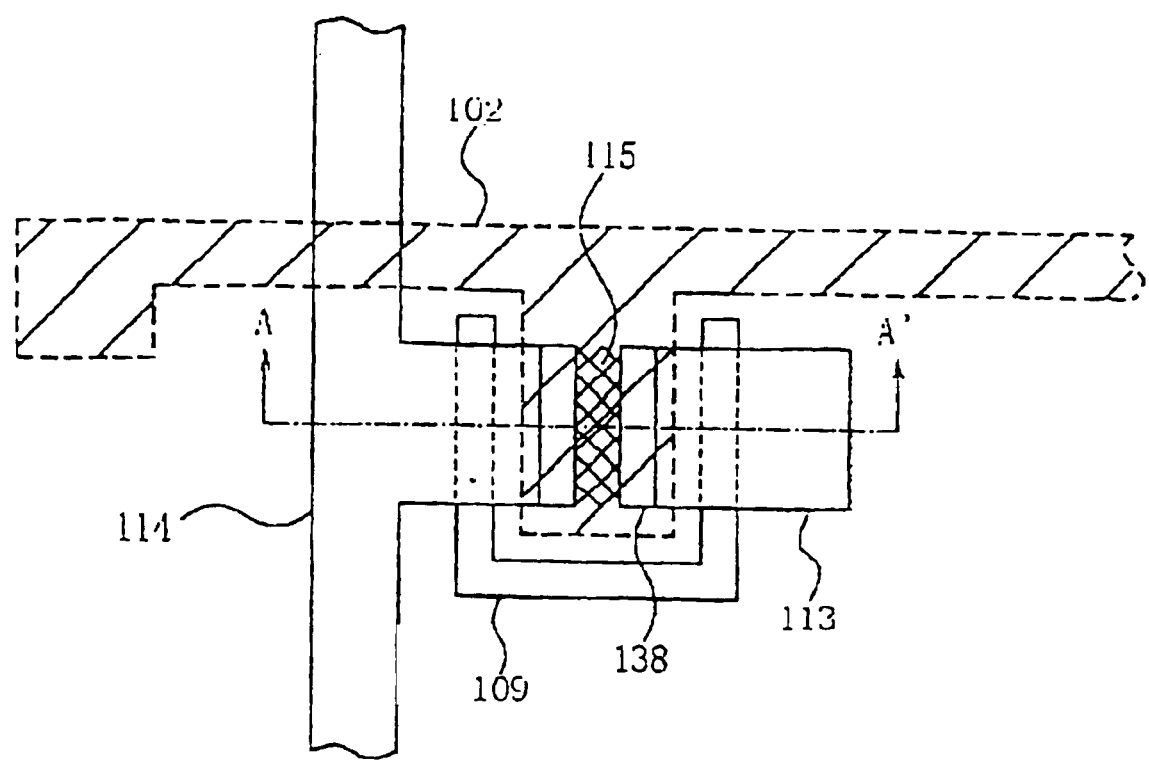
FIG. 11A is a fragmentary plan view of a thin film transistor of a second step involved in novel sequential fabrication processes in a second embodiment in accordance with the present invention.
Figure 11B:
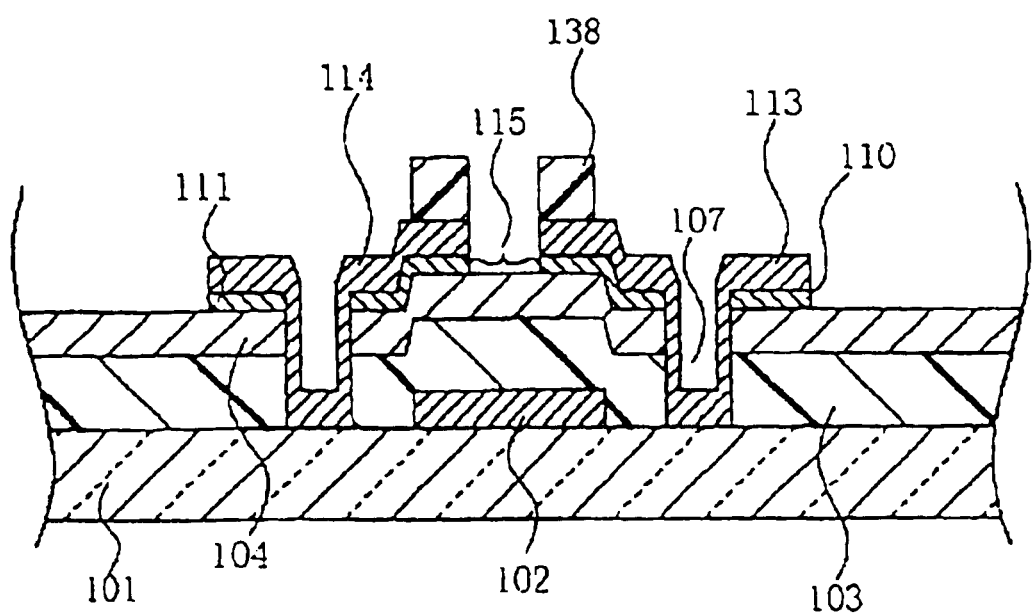
FIG. 11B is a fragmentary cross sectional elevation view of a thin film transistor shown in FIG. 11A, taken along an A–A' line.
Figure 12A:
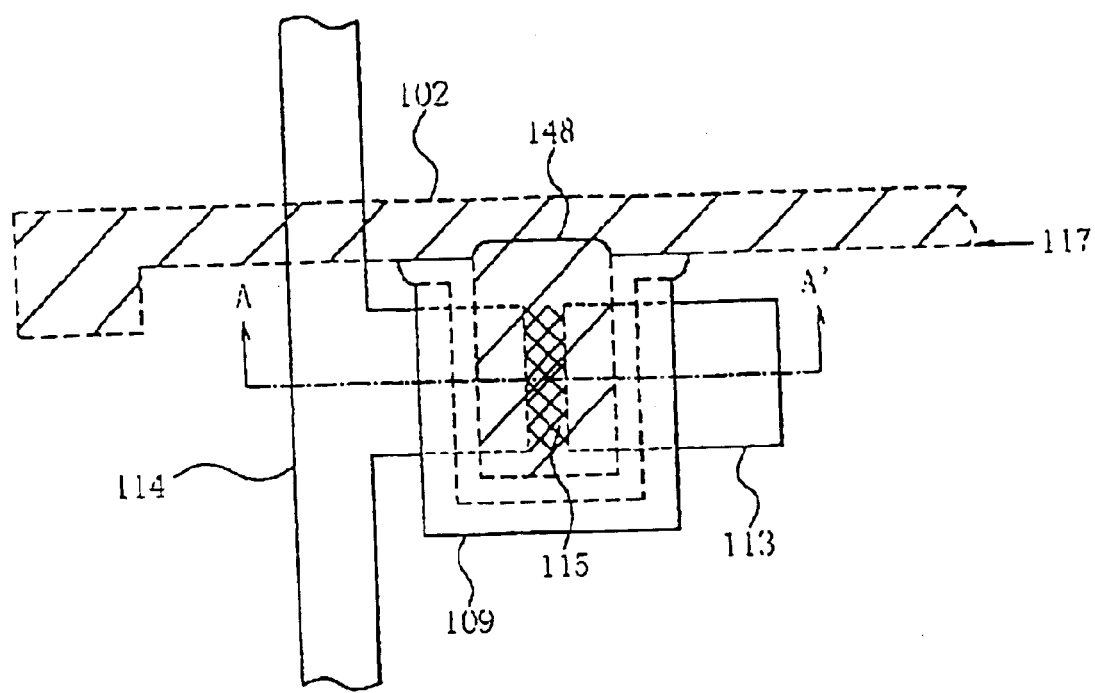
FIG. 12A is a fragmentary plan view of a thin film transistor of a third step involved in novel sequential fabrication processes in a second embodiment in accordance with the present invention.
Figure 12B:
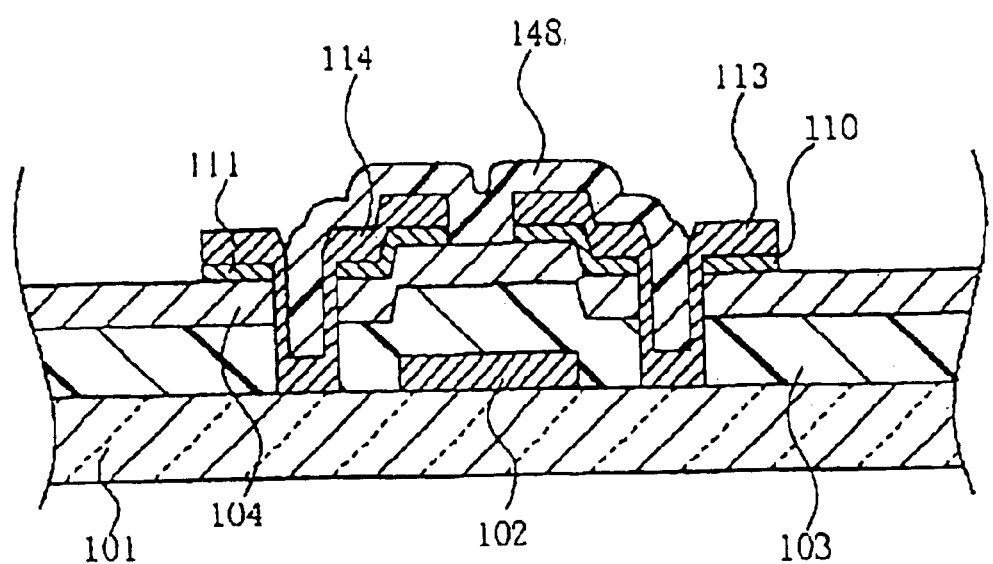
FIG. 12B is a fragmentary cross sectional elevation view of a thin film transistor shown in FIG. 12A, taken along an A–A' line.
Figure 13A:
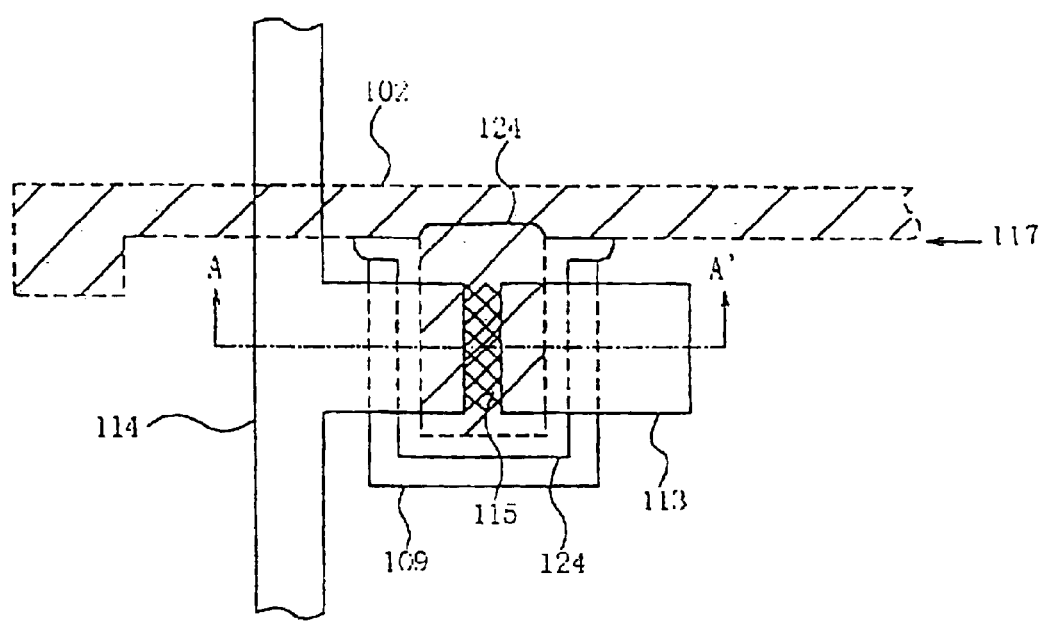
FIG. 13A is a fragmentary plan view of a thin film transistor of a fourth step involved in novel sequential fabrication processes in a second embodiment in accordance with the present invention.
Figure 13B:
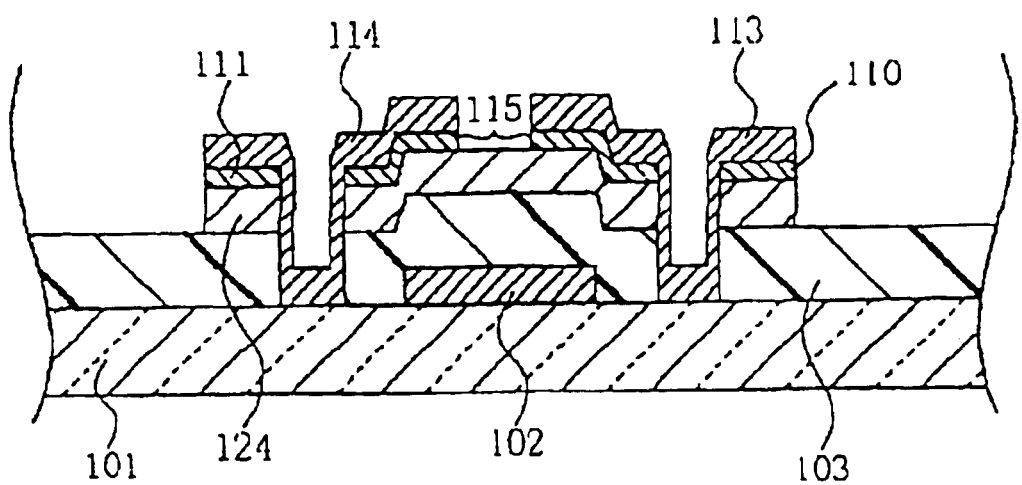
FIG. 13B is a fragmentary cross sectional elevation view of a thin film transistor shown in FIG. 13A, taken along an A–A' line.

A second embodiment according to the present invention will be described in detail with reference to the drawings. FIG. 10A is a fragmentary plan view of a thin film transistor of a first step involved in novel sequential fabrication processes in a second embodiment in accordance with the present invention. FIG. 10B is a fragmentary cross sectional elevation view of a thin film transistor shown in FIG. 10A, taken along an A–A' line. FIG. 11A is a fragmentary plan view of a thin film transistor of a second step involved in novel sequential fabrication processes in a second embodiment in accordance with the present invention. FIG. 11B is a fragmentary cross sectional elevation view of a thin film transistor shown in FIG. 11A, taken along an A–A' line. FIG. 12A is a fragmentary plan view of a thin film transistor of a third step involved in novel sequential fabrication processes in a second embodiment in accordance with the present invention. FIG. 12B is a fragmentary cross sectional elevation view of a thin film transistor shown in FIG. 12A, taken along an A–A' line. FIG. 13A is a fragmentary plan view of a thin film transistor of a fourth step involved in novel sequential fabrication processes in a second embodiment in accordance with the present invention. FIG. 13B is a fragmentary cross sectional elevation view of a thin film transistor shown in FIG. 13A, taken along an A–A' line. A thin film transistor is formed over an insulating substrate 101.

With reference to FIGS. 10A and 10B, a bottom conductive film is formed over a top surface of the insulating substrate 101. The bottom conductive film is patterned to form a gate electrode interconnection 102. The gate electrode interconnection 102 has a gate electrode 102 which has a rectangle shape in plan view. The gate electrode 102 extends from the gate electrode interconnection 102 in a direction perpendicular to a longitudinal direction of the gate electrode interconnection 102.

A gate insulating film 103 is formed over the insulating substrate 101 and the gate electrode interconnection 102, and the gate electrode 102. An amorphous silicon film 104 is formed over the upper surface of the gate insulating film 103. An n+-type amorphous silicon film 105 is formed over the upper surface of the amorphous silicon film 104.

The n+-type amorphous silicon film 105, the amorphous silicon film 104 and the gate insulating film 103 are selectively etched to form a trench groove 109 which extends in a form of generally U-shape in plan view. A bottom of the trench groove 109 comprises a part of the top surface of the insulating substrate 101. The trench groove 109 is generally U-shaped, so that the trench groove 109 surrounds the rectangle-shaped gate electrode 102. The trench groove 109 is separate from the gate electrode 102 and from the gate electrode interconnection 102. One side of the gate electrode 102 is bounded with the gate electrode interconnection 102. The trench groove 109 extends along the remaining three sides of the gate electrode 102. The trench groove 109 extends outside the gate electrode 102. The trench groove 109 has an uniform width.

With reference to FIGS. 11A and 11B, a conductive film 106 is entirely formed over the upper surface of the n+-type amorphous silicon film 105 and in the trench groove 109, wherein the bottom and side walls of the trench groove 109 are covered by the conductive film 106, but the trench groove 109 is not filled with the conductive film 106, whereby a reflow stopper groove 107 is formed in the trench groove 109. Namely, an upper surface of the conductive film 106 also has a reflow stopper groove 107 which extends in a form of generally U-shape in plan view. The reflow stopper groove 107, extends overlaps the U-shaped trench groove 109. The reflow stopper groove 107 is positioned along the U-shaped trench groove 109.

A resist mask 108 is selectively formed over the upper surface of the conductive film 106 by use of a lithography technique. The resist mask 8 comprises a thick resist mask 118 and a thin resist mask 128. The thick resist mask 118 is positioned in selected regions adjacent to a channel region 115 which has a rectangle shape. The selected regions also have rectangle shape regions along opposite outsides of the rectangle shape channel region 115. The thick resist mask 118 may have a thickness of about 3 micrometers. The thin resist mask 128 may have a thickness of about 0.2–0.7 micrometers.

A first etching process is carried out by use of the thick and thin resist masks 118 and 128 for selectively etching the conductive film 106 and the n+-type amorphous silicon film 105. The top conductive film 106 may comprise a metal film. The top conductive film 106 may selectively be etched by a wet etching process to form source and drain electrodes 113 and 114. The n+-type amorphous silicon film 105 may also selectively be etched by a dry etching process under a pressure of 10 Pa, at a power of 1000 W for 60 seconds, wherein source gas flow rate ratios of $SF_6$/HCl/He are 100/100/150 sccm to form ohmic contact layers 110 and 111 which underlie the source and drain electrodes 113 and 114, thereby making ohmic contacts between the amorphous silicon film 104 and the source and drain electrodes 113 and 114.

Subsequently, a plasma ashing process is carried out in the presence of plasma atmosphere with oxygen flow rate at 400 sccm under a pressure of 20 Pa, and an RF power of 1000 W for 120 seconds. This plasma ashing process reduces the thickness of the resist mask 8, whereby the thin resist mask 128 is removed whilst the thick resist mask 118 is reduced in thickness, whereby the thickness-reduced resist mask 118 becomes a residual resist mask 138 which extends on the selected regions adjacent to the channel region 115.

With reference to FIGS. 12A and 12B, the residual resist mask 138 is then exposed to a steam of a solution which contains an organic solvent at 27° C. for 1–3 minutes. This exposure process causes the organic solvent to osmose into the residual resist mask 138, whereby the residual resist mask 138 is dissolved and re-flowed, and the residual resist mask 138 becomes a reflow-deformed resist mask 148.

A part of the re-flowed resist mask 148 is dropped into the channel region 115 and other parts of the re-flowed resist mask 148 are dropped into the reflow stopper groove 107 which extends in a form of the generally U-shape and positioned in the generally U-shaped trench groove 109. An inward reflow of the resist mask 148 is dropped into the channel region 115 and a further inward reflow of the resist mask 148 is restricted by the channel region 115. An outward reflow of the resist mask 148 is omnidirectional. The outward reflow of the resist mask 148 in one direction toward a step-like barrier wall 117 which extends indirectly over an edge of the gate electrode interconnection 102 is stopped or restricted by the step-like barrier wall 117. The remaining outward reflow of the resist mask 148 in the remaining three directions toward the reflow stopper groove 107 is dropped into the reflow stopper groove 107 and stopped or restricted by the reflow stopper groove 107. Each gap between ends of the reflow stopper groove 107 and the step-like barrier wall 117 is so narrow as substantially restricting a further outward reflow of the resist mask 148. An external shape or a circumferential shape of the reflow-deformed resist mask 148 provides a pattern shape. The external shape or a circumferential shape of the reflow-deformed resist mask 148 is defined by the step-like barrier wall 117 and outside edges of the reflow stopper groove 107. The step-like barrier wall 117 and the reflow stopper groove 107 enable a highly accurate control or definition to the pattern shape of the reflow-deformed resist mask 148. As long as the positions of the step-like barrier wall 117 and the reflow stopper groove 107 are highly accurate, the pattern shape of the reflow-deformed resist mask 148 is also highly accurate. Since the highly accurate positioning of the step-like barrier wall 117 and the reflow stopper groove 107 is relatively easy by use of the known techniques, it is also relatively easy to obtain the desired highly accurate control or definition to the pattern shape of the reflow-deformed resist mask 148.

With reference to FIGS. 13A and 13B, a second etching process is carried out by use of the deformed resist mask 148 in combination with the source and drain electrodes 113 and 114 as combined masks for selectively etching the amorphous silicon film 104, whereby the amorphous silicon film 104 becomes an island layer 124 which has a pattern shape which is defined by the deformed resist mask 148 in combination with the source and drain electrodes 113 and 114 as combined masks. The used deformed resist mask 148 is then removed, whereby a thin film transistor is formed.

The island layer 124 of amorphous silicon underlies the ohmic contact layers 110 and 111. The island layer 124 is thus electrically connected to the source and drain electrodes 113 and 114. A parasitic capacitance between the gate electrode 102 and the source and drain electrodes 113 and 114 depends on the pattern shape of the island layer 124. Since it is possible to obtain a highly accurate control or definition to the pattern shape of the reflow-deformed resist mask 148 or the pattern shape of the island layer 124, it is possible to obtain a highly accurate control to the parasitic capacitance.

In the above described embodiment, the reflow of the residual resist film 138 is caused by exposing the residual resist film 138 to the steam which contains the solution containing the organic solvent. Any other know methods for causing the re-flow of the resist mask are, of course, available. The re-flow may be caused by applying a heat to the resist mask.

The above novel method is further applicable to deformation to other pattern film than the resist mask, provided the pattern is allowed to be re-flowed by any available measures.

Figure 14A:
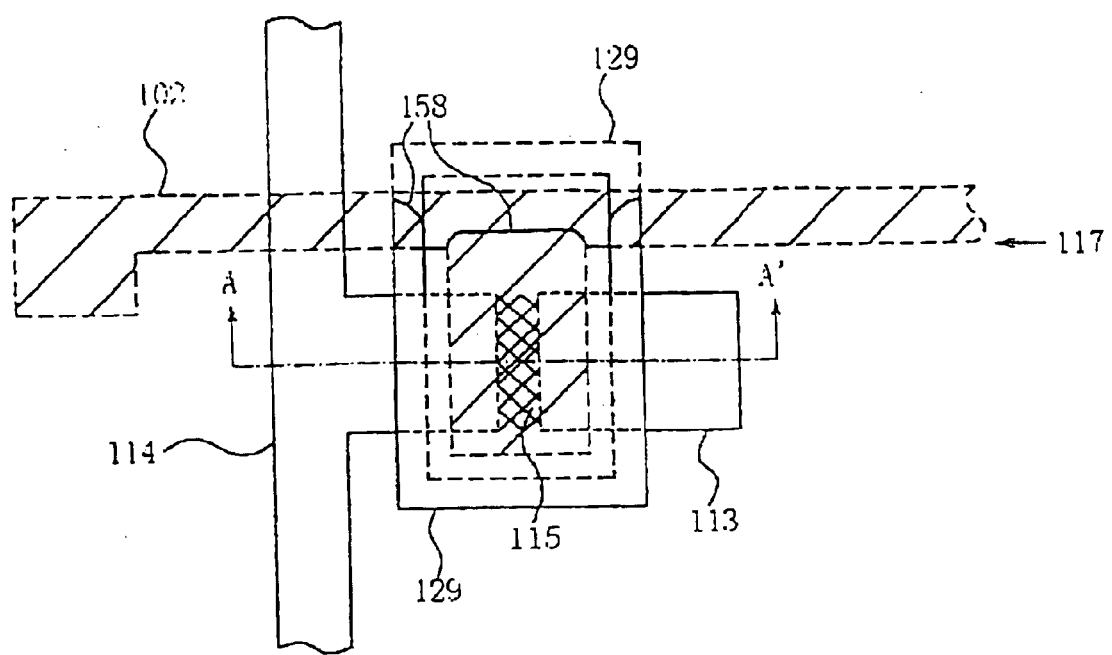
FIG. 14A is a fragmentary plan view of a thin film transistor of a third step involved in novel sequential fabrication processes in a first modification to the second embodiment in accordance with the present invention.
Figure 14B:
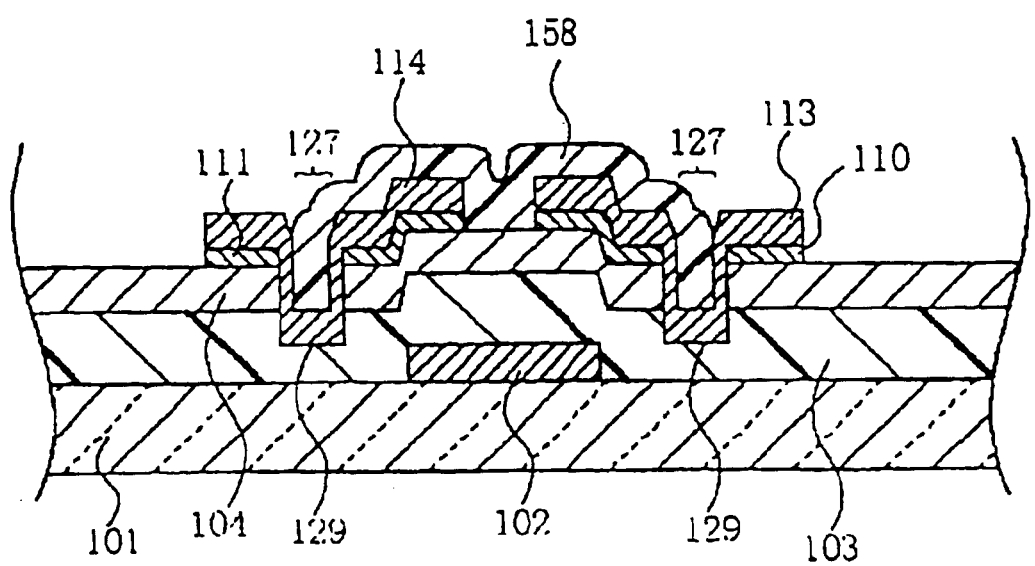
FIG. 14B is a fragmentary cross sectional elevation view of a thin film transistor shown in FIG. 14A, taken along an A–A' line.

The above described novel method of the second embodiment may be modified as follows. FIG. 14A is a fragmentary plan view of a thin film transistor of a third step involved in novel sequential fabrication processes in a first modification to the second embodiment in accordance with the present invention. FIG. 14B is a fragmentary cross sectional elevation view of a thin film transistor shown in FIG. 14A, taken along an A–A' line.

The following descriptions will focus on the difference of the first modified method from the above novel method of the second embodiment. In the above novel method of the second embodiment, the trench groove 109 is formed in generally U-shape, so that the trench groove 109 incompletely surrounds the gate electrode 102 in the three directions other than one direction toward the gate electrode interconnection 102, in order to keep the trench groove 109 separate from the gate electrode interconnection 102. Further, the trench groove 109 has a depth which is the same level as the top surface of the insulating substrate 101. Namely, the bottom of the trench groove 109 comprises a part of the top surface of the insulating substrate 101.

In accordance with this first modification to the above novel method of the second embodiment, a trench groove 129 is formed in rectangle annular shape in plan view, so that the trench groove 129 completely surrounds the gate electrode 102 in all directions, with keeping the trench groove 129 separate from the gate electrode interconnection 102, because the trench groove 129 has a shallower depth which is upper level than the top surface of the insulating substrate 101. Namely, the bottom of the trench groove 109 has an intermediate level of the gate insulating film 103.

With reference to FIGS. 14A and 14B, the n+-type amorphous silicon film 105, the amorphous silicon film 104 and the gate insulating film 103 are selectively etched to form a trench groove 129 which extends in a form of generally rectangle annular shape in plan view. A bottom of the trench groove 109 has an upper level than a top level of the gate electrode interconnection 102. The trench groove 129 is generally rectangle annular shaped, so that the trench groove 129 surrounds the rectangle-shaped gate electrode 102 completely in all directions. The trench groove 129 is separate from the gate electrode 102 and from the gate electrode interconnection 102. The trench groove 129 extends outside the gate electrode 102. The trench groove 129 has an uniform width.

An upper surface of the conductive film 106 also has a reflow stopper groove 127 which extends in a form of generally rectangle annular shape in plan view. The reflow stopper groove 127 extends overlaps the generally rectangle annular shaped trench groove 129. The reflow stopper groove 127 is positioned along the generally rectangle annular shape trench groove 129.

In he re-flow process, a part of the re-flowed resist mask 158 is dropped into the channel region 115 and other parts of the re-flowed resist mask 158 are dropped into the reflow stopper groove 127 which extends in a form of the generally rectangle annular shape and positioned in the generally rectangle annular shape trench groove 129. An inward reflow of the resist mask 158 is dropped into the channel region 115 and a further inward reflow of the resist mask 158 is restricted by the channel region 115. An outward reflow of the resist mask 158 is omnidirectional. The outward reflow of the resist mask 158 in one direction toward a step-like barrier wall 117 which extends indirectly over an edge of the gate electrode interconnection 102 is stopped or restricted by the step-like barrier wall 117. The remaining outward reflow of the resist mask 158 in the remaining three directions toward the reflow stopper groove 127 is dropped into the reflow stopper groove 127 and stopped or restricted by the reflow stopper groove 127. An external shape or a circumferential shape of the reflow-deformed resist mask 148 provides a pattern shape. The external shape or a circumferential shape of the reflow-deformed resist mask 158 is defined by the step-like barrier wall 117 and outside edges of the reflow stopper groove 127. The step-like barrier wall 117 and the reflow stopper groove 127 enable a highly accurate control or definition to the pattern shape of the reflow-deformed resist mask 158. As long as the positions of the step-like barrier wall 117 and the reflow stopper groove 127 are highly accurate, the pattern shape of the reflow-deformed resist mask 158 is also highly accurate. Since the highly accurate positioning of the step-like barrier wall 117 and the reflow stopper groove 127 is relatively easy by use of the known techniques, it is also relatively easy to obtain the desired highly accurate control or definition to the pattern shape of the reflow-deformed resist mask 158.

Third Embodiment

Figure 15A:
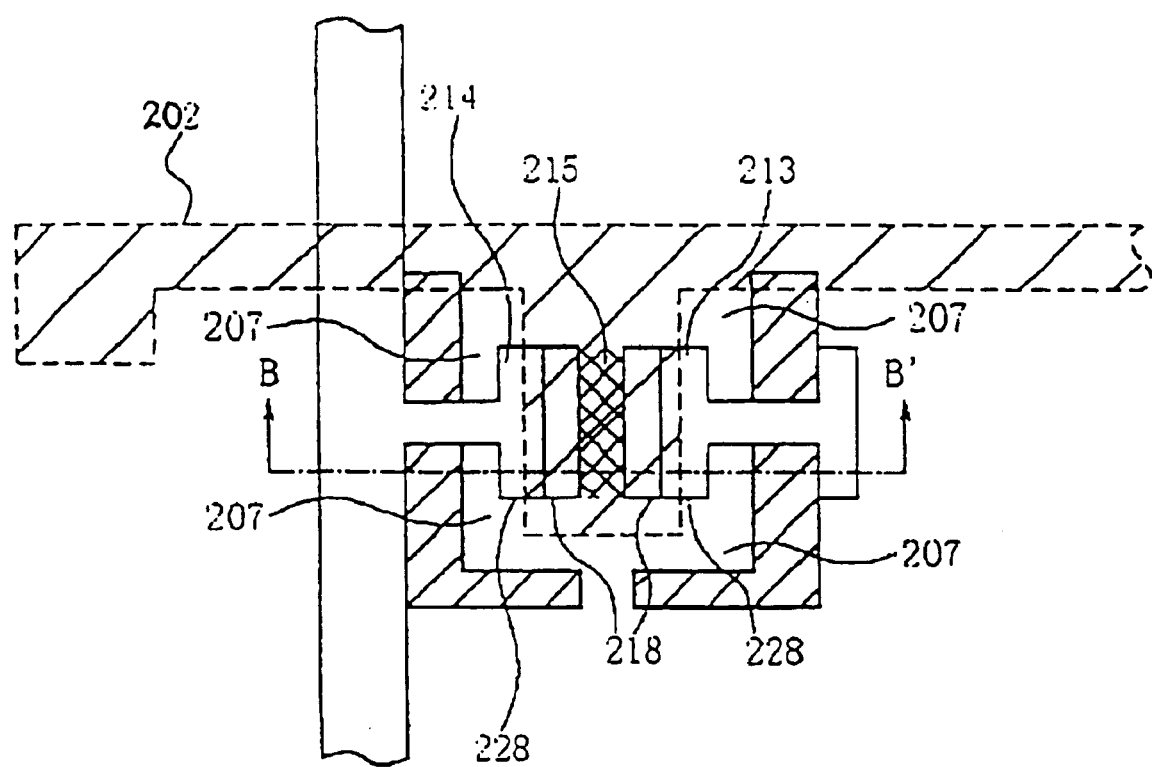
FIG. 15A is a fragmentary plan view of a thin film transistor of a first step involved in novel sequential fabrication processes in a third embodiment in accordance with the present invention.
Figure 15B:
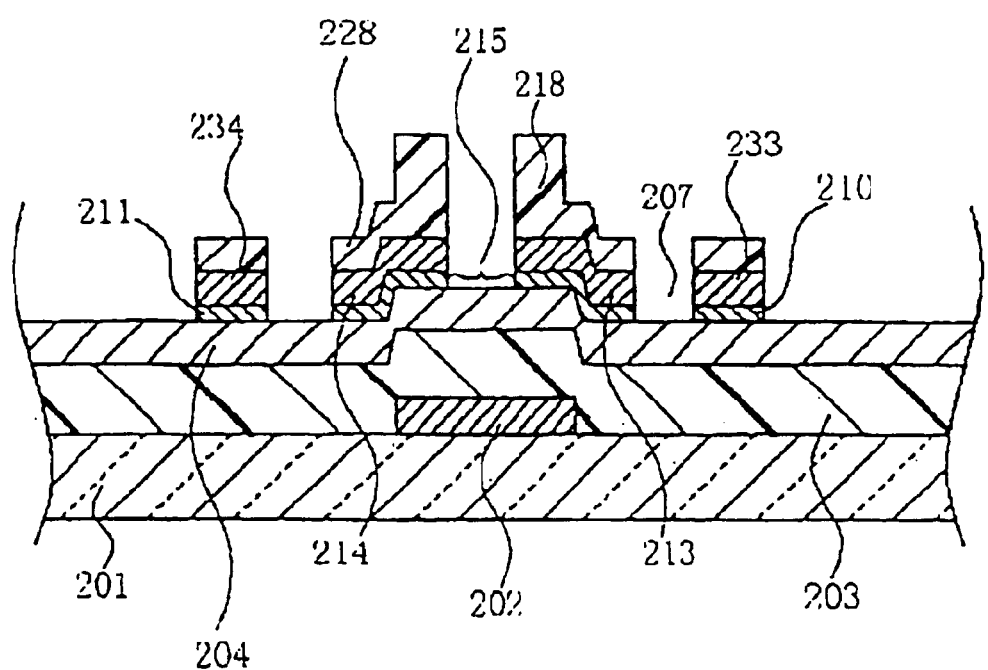
FIG. 15B is a fragmentary cross sectional elevation view of a thin film transistor shown in FIG. 15A, taken along an A–A' line.
Figure 16A:
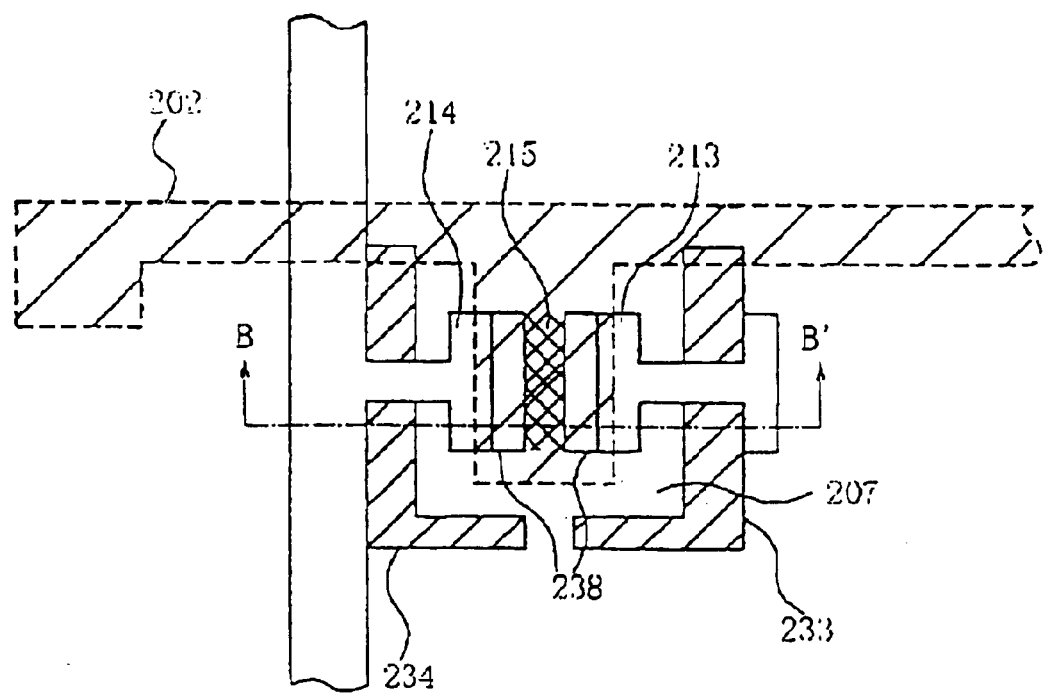
FIG. 16A is a fragmentary plan view of a thin film transistor of a second step involved in novel sequential fabrication processes in a third embodiment in accordance with the present invention.
Figure 16B:
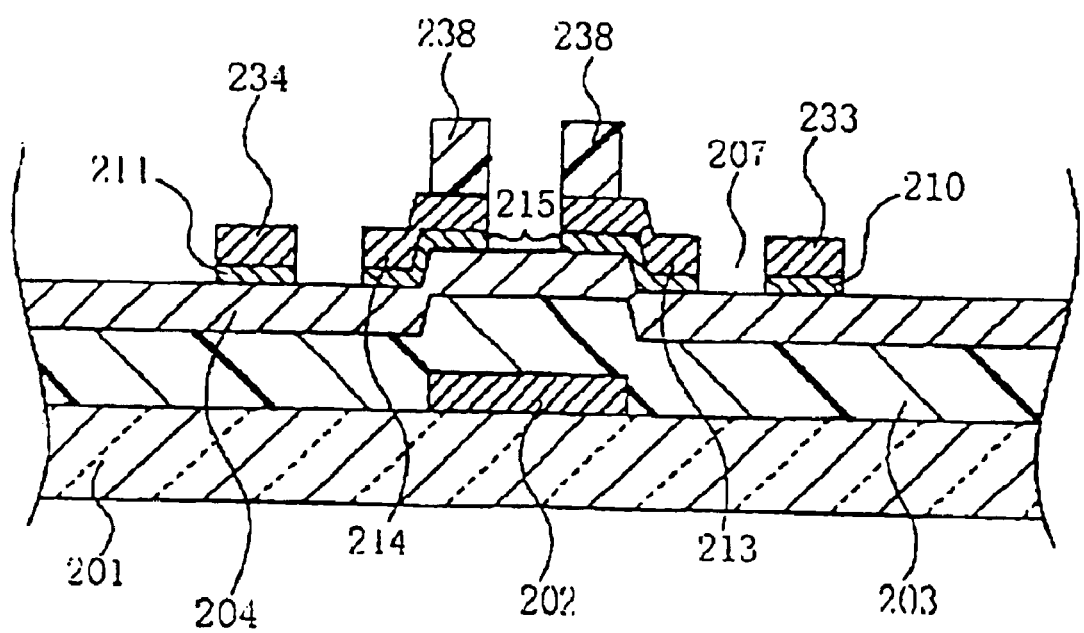
FIG. 16B is a fragmentary cross sectional elevation view of a thin film transistor shown in FIG. 16A, taken along an A–A' line.
Figure 17A:
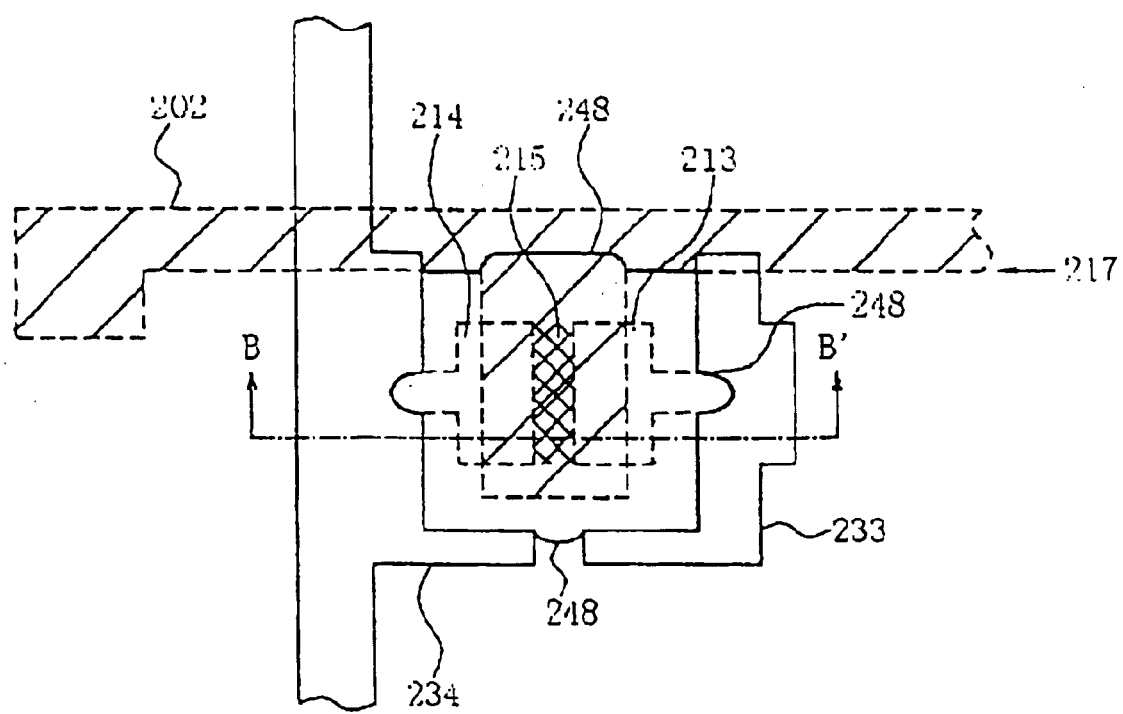
FIG. 17A is a fragmentary plan view of a thin film transistor of a third step involved in novel sequential fabrication processes in a third embodiment in accordance with the present invention.
Figure 17B:
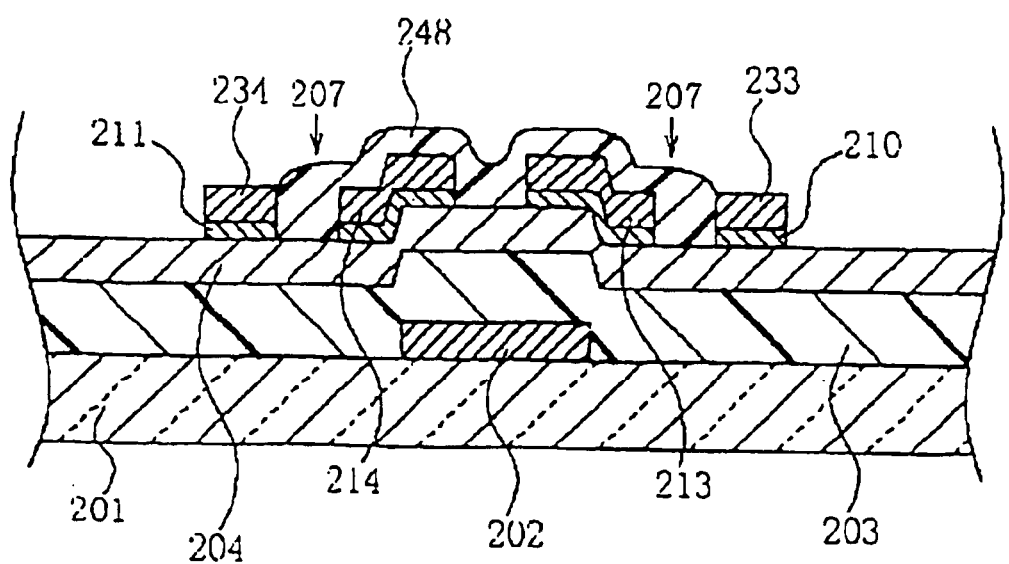
FIG. 17B is a fragmentary cross sectional elevation view of a thin film transistor shown in FIG. 17A, taken along a B–B' line.

A third embodiment according to the present invention will be described in detail with reference to the drawings. FIG. 15A is a fragmentary plan view of a thin film transistor of a first step involved in novel sequential fabrication processes in a third embodiment in accordance with the present invention. FIG. 15B is a fragmentary cross sectional elevation view of a thin film transistor shown in FIG. 15A, taken along an A–A' line. FIG. 16A is a fragmentary plan view of a thin film transistor of a second step involved in novel sequential fabrication processes in a third embodiment in accordance with the present invention. FIG. 16B is a fragmentary cross sectional elevation view of a thin film transistor shown in FIG. 16A, taken along an A–A' line. FIG. 17A is a fragmentary plan view of a thin film transistor of a third step involved in novel sequential fabrication processes in a third embodiment in accordance with the present invention. FIG. 17B is a fragmentary cross sectional elevation view of a thin film transistor shown in FIG. 17A, taken along a B–B' line. A thin film transistor is formed over an insulating substrate 201.

With reference to FIGS. 15A and 15B, a bottom conductive film is formed over a top surface of the insulating substrate 201. The bottom conductive film is patterned to form a gate electrode interconnection 202. The gate electrode interconnection 202 has a gate electrode 202 which has a rectangle shape in plan view. The gate electrode 202 extends from the gate electrode interconnection 202 in a direction perpendicular to a longitudinal direction of the gate electrode interconnection 202.

A gate insulating film 203 is formed over the insulating substrate 201 and the gate electrode interconnection 202, and the gate electrode 202. An amorphous silicon film 204 is formed over the upper surface of the gate insulating film 203. An n+-type amorphous silicon film 205 is formed over the upper surface of the amorphous silicon film 204. A conductive film 206 is entirely formed over the upper surface of the n+-type amorphous silicon film 205.

A resist mask 208 is selectively formed over the upper surface of the conductive film 206 by use of a lithography technique. The resist mask 208 comprises a thick resist mask 218 and a thin resist mask 228. The thick resist mask 218 is positioned in selected regions adjacent to a channel region 215 which has a rectangle shape. The selected regions also have rectangle shape regions along opposite outsides of the rectangle shape channel region 215. The thick resist mask 218 may have a thickness of about 3 micrometers. The thin resist mask 228 may have a thickness of about 0.2–0.7 micrometers.

A first etching process is carried out by use of the thick and thin resist masks 218 and 228 for selectively etching the conductive film 206 and the n+-type amorphous silicon film 205. The top conductive film 206 may comprise a metal film. The top conductive film 206 may selectively be etched by a wet etching process to form source and drain electrodes 213 and 214. The n+-type amorphous silicon film 205 may also selectively be etched by a dry etching process under a pressure of 10 Pa, at a power of 1000 W for 60 seconds, wherein source gas flow rate ratios of $SF_6$/HCl/He are 100/100/150 sccm.

As a result of this etching process, the n+-type amorphous silicon film 205 and the conductive film 206 are patterned to form a reflow stopper groove 207 which extends in a form of generally U-shape in plan view. Further, the n+-type amorphous silicon film 205 and the channel region 215 are patterned. The patterned n+-type amorphous silicon film 205 becomes ohmic contact layers 210 and 211. The patterned conductive film 206 becomes source and drain electrodes 213 and 214 adjacent to the channel region 215 and also dummy source and drain electrodes 233 and 234.

Each of the dummy source and drain electrodes 233 and 234 extends in a form of generally L-shape in plan view, so that the paired dummy source and drain electrodes 233 and 234 extend in a form of generally U-shape in plan view, provided that the paired dummy source and drain electrodes 233 and 234 are separate from each other. In plan view, the paired dummy source and drain electrodes 233 and 234 surround the rectangle-shaped gate electrode 202 in three directions other than a direction toward the gate electrode interconnection 202. The paired dummy source and drain electrodes 233 and 234 are separated from the paired source and drain electrodes 213 and 214 by the reflow stopper groove 207. Accordingly, the paired dummy source and drain electrodes 233 and 234 define outside edges of the reflow stopper groove 207, while the paired source and drain electrodes 213 and 214 define inside edges of the reflow stopper groove 207. A bottom of the reflow stopper groove 207 comprises a part of the upper surface of the amorphous silicon film 204.

With reference to FIGS. 16A and 16B, a plasma ashing process is carried out in the presence of plasma atmosphere with oxygen flow rate at 400 sccm under a pressure of 20 Pa, and an RF power of 1000 W for 120 seconds. This plasma ashing process reduces the thickness of the resist mask 208, whereby the thin resist mask 228 is removed whilst the thick resist mask 218 is reduced in thickness, whereby the thickness-reduced resist mask 218 becomes a residual resist mask 238 which extends on the selected regions adjacent to the channel region 215.

With reference to FIGS. 17A and 17B, the residual resist mask 238 is then exposed to a steam of a solution which contains an organic solvent at 27° C. for 1–3 minutes. This exposure process causes the organic solvent to osmose into the residual resist mask 238, whereby the residual resist mask 238 is dissolved and re-flowed, and the residual resist mask 238 becomes a reflow-deformed resist mask 248.

A part of the re-flowed resist mask 248 is dropped into the channel region 215 and other parts of the re-flowed resist mask 248 are dropped into the reflow stopper groove 207 which extends in a form of the generally U-shape and positioned in the generally U-shaped trench groove 109. An inward reflow of the resist mask 248 is dropped into the channel region 215 and a further inward reflow of the resist mask 248 is restricted by the channel region 215. An outward reflow of the resist mask 248 is omnidirectional. The outward reflow of the resist mask 248 in one direction toward a step-like barrier wall 217 which extends indirectly over an edge of the gate electrode interconnection 202 is stopped or restricted by the step-like barrier wall 217. The remaining outward reflow of the resist mask 248 in the remaining three directions toward the reflow stopper groove 207 is dropped into the reflow stopper groove 207 and stopped or restricted by the reflow stopper groove 207. A gap between ends of the paired dummy source and drain electrodes 233 and 234 is so narrow as substantially restricting a further outward reflow of the resist mask 248.

An external shape or a circumferential shape of the reflow-deformed resist mask 248 provides a pattern shape. The external shape or a circumferential shape of the reflow-deformed resist mask 248 is defined by the step-like barrier wall 217 and outside edges of the reflow stopper groove 207. The step-like barrier wall 217 and the reflow stopper groove 207 enable a highly accurate control or definition to the pattern shape of the reflow-deformed resist mask 248. As long as the positions of the step-like barrier wall 217 and the reflow stopper groove 207 are highly accurate, the pattern shape of the reflow-deformed resist mask 248 is also highly accurate. Since the highly accurate positioning of the step-like barrier wall 217 and the reflow stopper groove 207 is relatively easy by use of the known techniques, it is also relatively easy to obtain the desired highly accurate control or definition to the pattern shape of the reflow-deformed resist mask 248.

A second etching process is carried out by use of the deformed resist mask 248 in combination with the source and drain electrodes 213 and 214 as combined masks for selectively etching the amorphous silicon film 204, whereby the amorphous silicon film 204 becomes an island layer 224 which has a pattern shape which is defined by the deformed resist mask 248 in combination with the source and drain electrodes 213 and 214 as combined masks. The used deformed resist mask 248 is then removed, whereby a thin film transistor is formed.

The island layer 224 of amorphous silicon underlies the ohmic contact layers 210 and 211. The island layer 224 is thus electrically connected to the source and drain electrodes 213 and 214. A parasitic capacitance between the gate electrode 202 and the source and drain electrodes 213 and 214 depends on the pattern shape of the island layer 224. Since it is possible to obtain a highly accurate control or definition to the pattern shape of the reflow-deformed resist mask 248 or the pattern shape of the island layer 124, it is possible to obtain a highly accurate control to the parasitic capacitance.

In the above described embodiment, the reflow of the residual resist film 238 is caused by exposing the residual resist film 238 to the steam which contains the solution containing the organic solvent. Any other know methods for causing the re-flow of the resist mask are, of course, available. The re-flow may be caused by applying a heat to the resist mask.

The above novel method is further applicable to deformation to other pattern film than the resist mask, provided the pattern is allowed to be re-flowed by any available measures.

Fourth Embodiment

Figure 18A:
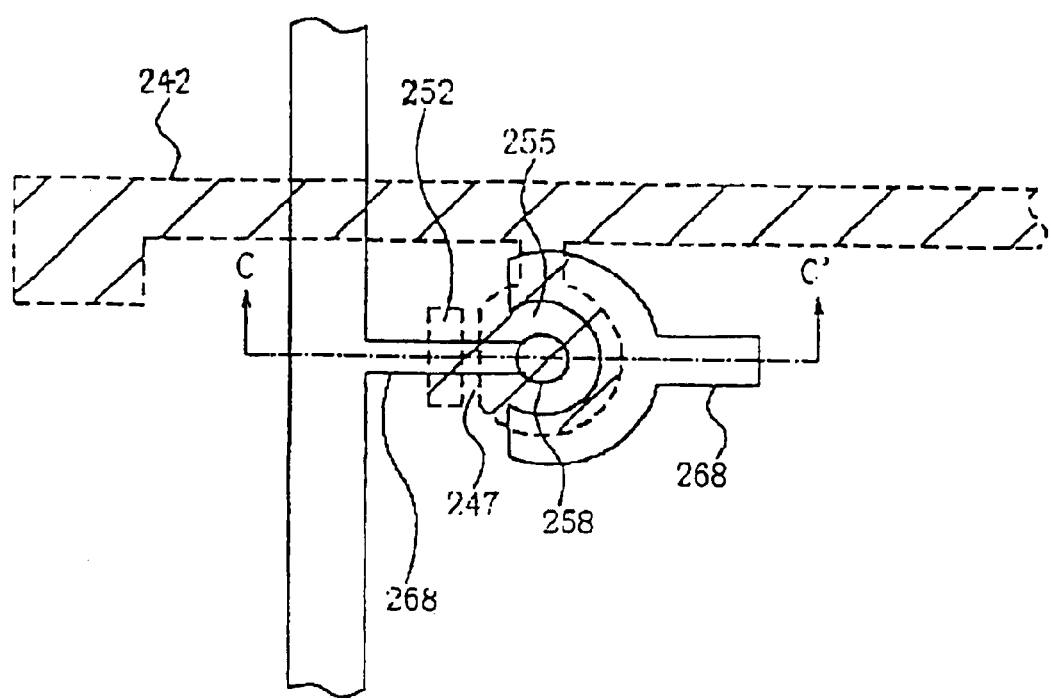
FIG. 18A is a fragmentary plan view of a thin film transistor of a first step involved in novel sequential fabrication processes in a fourth embodiment in accordance with the present invention.
Figure 18B:
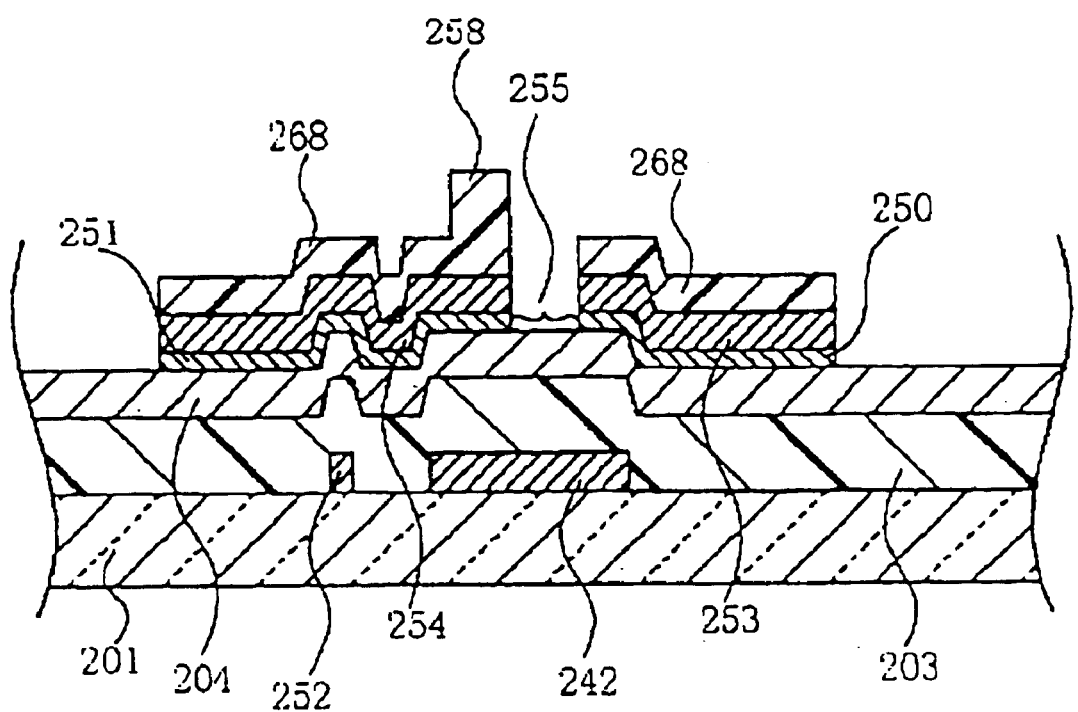
FIG. 18B is a fragmentary cross sectional elevation view of a thin film transistor shown in FIG. 18A, taken along a C–C' line.
Figure 19A:
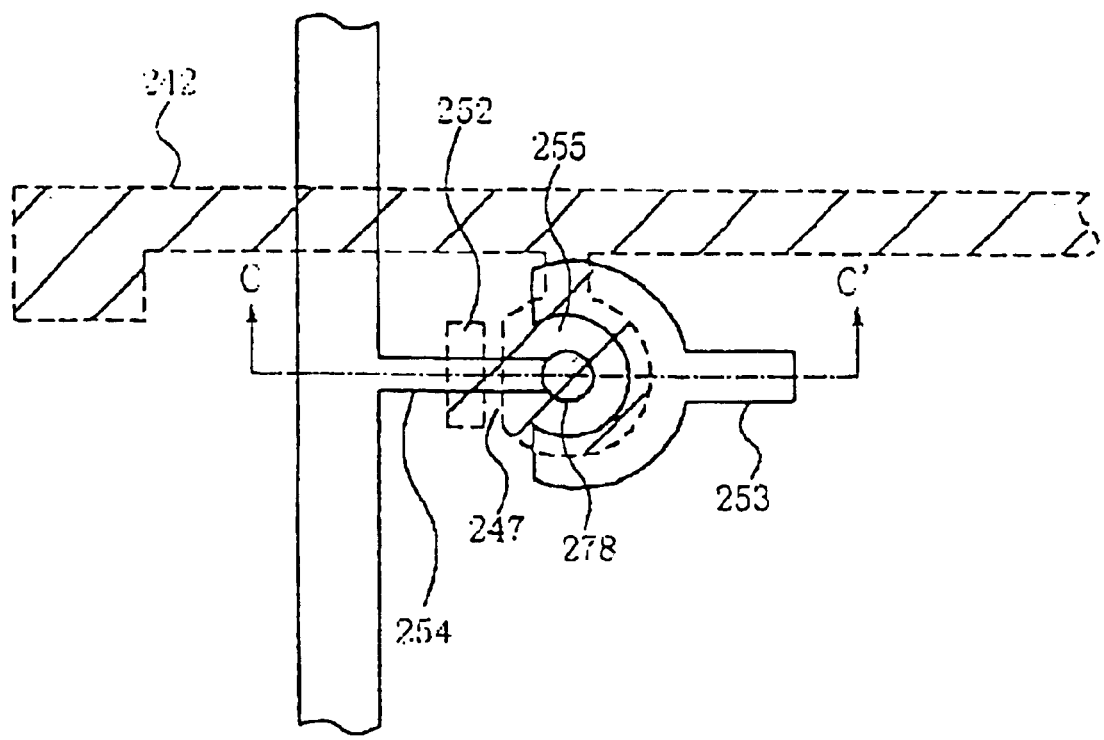
FIG. 19A is a fragmentary plan view of a thin film transistor of a second step involved in novel sequential fabrication processes in a fourth embodiment in accordance with the present invention.
Figure 19B:
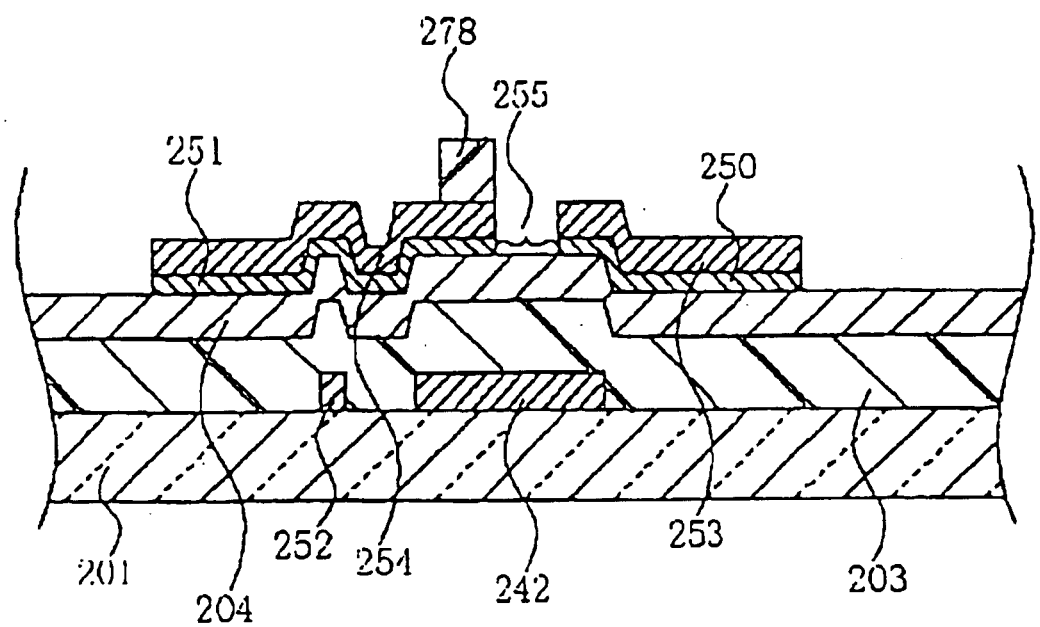
FIG. 19B is a fragmentary cross sectional elevation view of a thin film transistor shown in FIG. 19A, taken along a C–C' line.
Figure 20A:
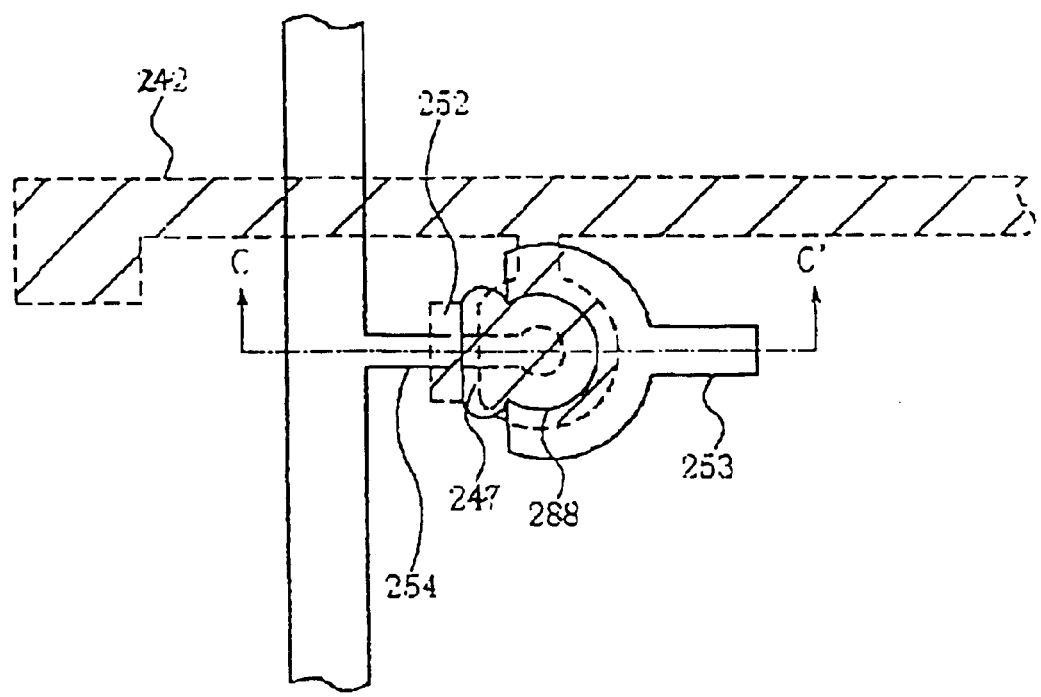
FIG. 20A is a fragmentary plan view of a thin film transistor of a third step involved in novel sequential fabrication processes in a fourth embodiment in accordance with the present invention.
Figure 20B:
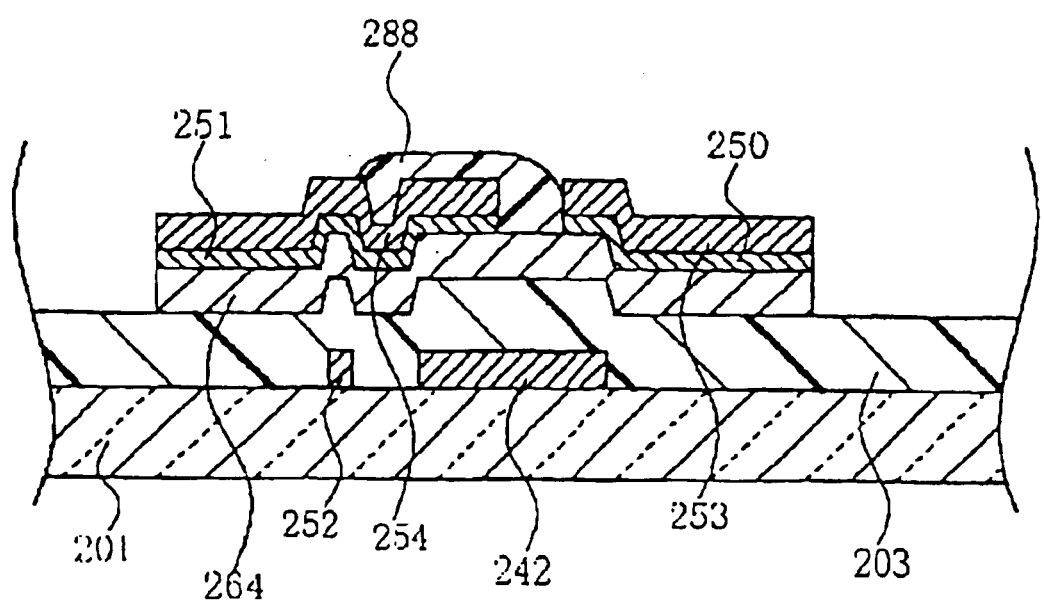
FIG. 20B is a fragmentary cross sectional elevation view of a thin film transistor shown in FIG. 20A, taken along a C–C' line.

A fourth embodiment according to the present invention will be described in detail with reference to the drawings. FIG. 18A is a fragmentary plan view of a thin film transistor of a first step involved in novel sequential fabrication processes in a fourth embodiment in accordance with the present invention. FIG. 18B is a fragmentary cross sectional elevation view of a thin film transistor shown in FIG. 18A, taken along a C–C' line. FIG. 19A is a fragmentary plan view of a thin film transistor of a second step involved in novel sequential fabrication processes in a fourth embodiment in accordance with the present invention. FIG. 19B is a fragmentary cross sectional elevation view of a thin film transistor shown in FIG. 19A, taken along a C–C' line. FIG. 20A is a fragmentary plan view of a thin film transistor of a third step involved in novel sequential fabrication processes in a fourth embodiment in accordance with the present invention. FIG. 20B is a fragmentary cross sectional elevation view of a thin film transistor shown in FIG. 20A, taken along a C–C' line. A thin film transistor is formed over an insulating substrate 201.

With reference to FIGS. 18A and 18B, a bottom conductive film is formed over a top surface of the insulating substrate 201. The bottom conductive film is patterned to form a gate electrode interconnection 242 and a dummy gate electrode 252. The gate electrode interconnection 242 has a gate electrode 242 which has a generally circular shape with a flat side in plan view. The flat side of the generally circular shape gate electrode 242 is adjacent to and separate from the dummy gate electrode 252. The gate electrode 242 extends from the gate electrode interconnection 242 in a direction perpendicular to a longitudinal direction of the gate electrode interconnection 242. The flat side of the generally circular shape gate electrode 242 is perpendicular to the longitudinal direction of the gate electrode interconnection 242. The dummy gate electrode 252 is generally I-shaped or rectangle-shape, so that the dummy gate electrode 252 is adjacent to and separate from the flat side of the generally circular shape gate electrode 242.

The dummy gate electrode 252 is thus separate from the gate electrode 242 and from the gate electrode interconnection 242. One side of the generally circular shape gate electrode 242 is connected through an extending part from the gate electrode interconnection 242, wherein the extending part extends in perpendicular to the longitudinal direction of the gate electrode interconnection 242. An I-shaped or rectangle-shaped gap is defined between the dummy gate electrode 252 and the flat side of the generally circular shape gate electrode 242. The I-shaped gap has an uniform width.

A gate insulating film 203 is formed over the insulating substrate 201 and the gate electrode interconnection 242, the gate electrode 242 and the dummy gate electrode 252, wherein the gate insulating film 203 fills the I-shaped gap between the dummy gate electrode 252 and the flat side of the generally circular shape gate electrode 242. An upper surface of the gate insulating film 203 has a groove which extends in a form of generally I-shape in plan view. The groove extends over the I-shaped gap between the flat side of the generally circular shape gate electrode 242 and the dummy gate electrode 252. The groove in the upper surface of the gate insulating film 203 is thus formed by the I-shaped gap between the flat side of the generally circular shape gate electrode 242 and the dummy gate electrode 252.

An amorphous silicon film 204 is formed over the upper surface of the gate insulating film 203. An upper surface of the amorphous silicon film 204 also has a groove which extends in a form of generally I-shape in plan view. The groove extends over the I-shaped groove in the upper surface of the gate insulating film 203.

An n+-type amorphous silicon film 205 is formed over the upper surface of the amorphous silicon film 204. An upper surface of the n+-type amorphous silicon film 205 also has a groove which extends in a form of generally I-shape in plan view. The groove extends over the I-shaped groove in the upper surface of the amorphous silicon film 204.

A top conductive film 206 is formed over the upper surface of the n+-type amorphous silicon film 205. An upper surface of the top conductive film 206 also has a reflow stopper groove 247 which extends in a form of generally I-shape in plan view. The reflow stopper groove 247 extends over the I-shaped groove in the upper surface of the n+-type amorphous silicon film 205. The reflow stopper groove 247 is positioned indirectly over the I-shaped gap between the flat side of the generally circular shape gate electrode 242 and the dummy gate electrode 252.

A resist mask 208 is selectively formed over the upper surface of the top conductive film 206 by use of a lithography technique. The resist mask 208 comprises a thick resist mask 258 and a thin resist mask 268. The thick resist mask 258 is positioned in selected regions adjacent to a channel region 255 which has a partial circle shape or C-shape. The selected regions also have rectangle shape regions along opposite outsides of the rectangle shape channel region 255. The thick resist mask 258 may have a thickness of about 3 micrometers. The thin resist mask 268 may have a thickness of about 0.2–0.7 micrometers.

A first etching process is carried out by use of the thick and thin resist masks 18 and 28 for selectively etching the top conductive film 206 and the n+-type amorphous silicon film 205. The top conductive film 206 may comprise a metal film. The top conductive film 206 may selectively be etched by a wet etching process to form source and drain electrodes 253 and 254. The n+-type amorphous silicon film 205 may also selectively be etched by a dry etching process under a pressure of 10 Pa, at a power of 1000 W for 60 seconds, wherein source gas flow rate ratios of $SF_6$/HCl/He are 100/100/150 sccm to form ohmic contact layers 250 and 251 which underlie the source and drain electrodes 253 and 254, thereby making ohmic contacts between the amorphous silicon film 204 and the source and drain electrodes 253 and 254. As a result, the channel region 255, which has a partial circle shape or C-shape, is defined.

With reference to FIGS. 19A and 19B, a plasma ashing process is carried out in the presence of plasma atmosphere with oxygen flow rate at 400 sccm under a pressure of 20 Pa, and an RF power of 1000 W for 120 seconds. This plasma ashing process reduces the thickness of the resist mask 208, whereby the thin resist mask 268 is removed whilst the thick resist mask 258 is reduced in thickness, whereby the thickness-reduced resist mask 258 becomes a residual resist mask 278 which extends on the selected region which corresponds to a circular-shaped island portion of the drain electrode 254. The selected region, on which the residual resist mask 278 remains, is surrounded by the C-shaped or partially circle shaped channel region 255.

With reference to FIGS. 20A and 20B, the residual resist mask 278 is then exposed to a steam of a solution which contains an organic solvent. This exposure process causes the organic solvent to osmose into the residual resist mask 278, whereby the residual resist mask 278 is dissolved and re-flowed, and the residual resist mask 278 becomes a reflow-deformed resist mask 288.

A part of the re-flowed resist mask 288 is dropped into the C-shaped channel region 255 and other part of the re-flowed resist mask 288 is dropped into the reflow stopper groove 247 which extends in a form of the generally I-shape and positioned indirectly over the I-shaped gap between the gate electrode 242 and the dummy gate electrode 252. No inward reflow of the resist mask 288 is caused. An outward reflow of the resist mask 288 is omnidirectional. The outward reflow of the resist mask 288 is dropped into the C-shaped channel region 255 and the I-shaped reflow stopper groove 247 and stopped or restricted by the reflow stopper groove 247 and the C-shaped channel region 255. An external shape or a circumferential shape of the reflow-deformed resist mask 48 provides a pattern shape. The external shape or a circumferential shape of the reflow-deformed resist mask 48 is almost defined by the outside edge of the C-shaped channel region 255 and the reflow stopper groove 247. The outside edge of the C-shaped channel region 255 and the reflow stopper groove 247 enable a highly accurate control or definition to the pattern shape of the reflow-deformed resist mask 288. As long as the definitions of the outside edge of the C-shaped channel region 255 and the reflow stopper groove 247 are highly accurate, the pattern shape of the reflow-deformed resist mask 288 is also highly accurate. Since the highly accurate definitions of the outside edge of the C-shaped channel region 255 and the reflow stopper groove 247 are relatively easy by use of the known techniques, it is also relatively easy to obtain the desired highly accurate control or definition to the pattern shape of the reflow-deformed resist mask 288.

A second etching process is carried out by use of the deformed resist mask 288 in combination with the source and drain electrodes 253 and 254 as combined masks for selectively etching the amorphous silicon film 204, whereby the amorphous silicon film 204 becomes an island layer 264 which has a pattern shape which is defined by the deformed resist mask 288 in combination with the source and drain electrodes 253 and 254 as combined masks. The used deformed resist mask 288 is then removed, whereby a thin film transistor is formed.

The island layer 264 of amorphous silicon underlies the ohmic contact layers 250 and 251. The island layer 264 is thus electrically connected to the source and drain electrodes 253 and 254. A parasitic capacitance between the gate electrode 242 and the source and drain electrodes 253 and 254 depends on the pattern shape of the island layer 264. Since it is possible to obtain a highly accurate control or definition to the pattern shape of the reflow-deformed resist mask 288 or the pattern shape of the island layer 264, it is possible to obtain a highly accurate control to the parasitic capacitance.

In the above described embodiment, the reflow of the residual resist film 278 is caused by exposing the residual resist film 278 to the steam which contains the solution containing the organic solvent. Any other know methods for causing the re-flow of the resist mask are, of course, available. The re-flow may be caused by applying a heat to the resist mask.

The above novel method is further applicable to deformation to other pattern film than the resist mask, provided the pattern is allowed to be re-flowed by any available measures.

In accordance with this novel method, the channel region 255, the source electrode 253 are partially circle shape or C-shape. It is, however, possible to modify this shape into the rectangle, square and other polygonal shape, provided that the outward reflow of the resist film is restricted by the channel region and the reflow stopper groove.

Fifth Embodiment

Figure 21A:
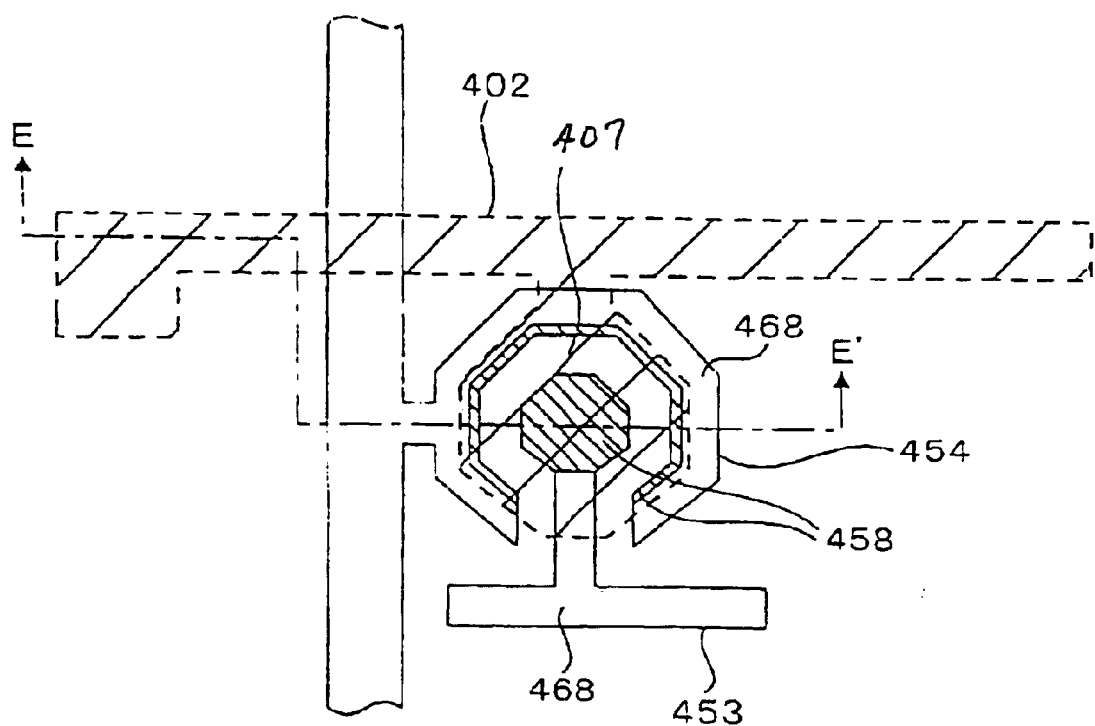
FIG. 21A is a fragmentary plan view of a thin film transistor of a first step involved in novel sequential fabrication processes in a fifth embodiment in accordance with the present invention.
Figure 21B:
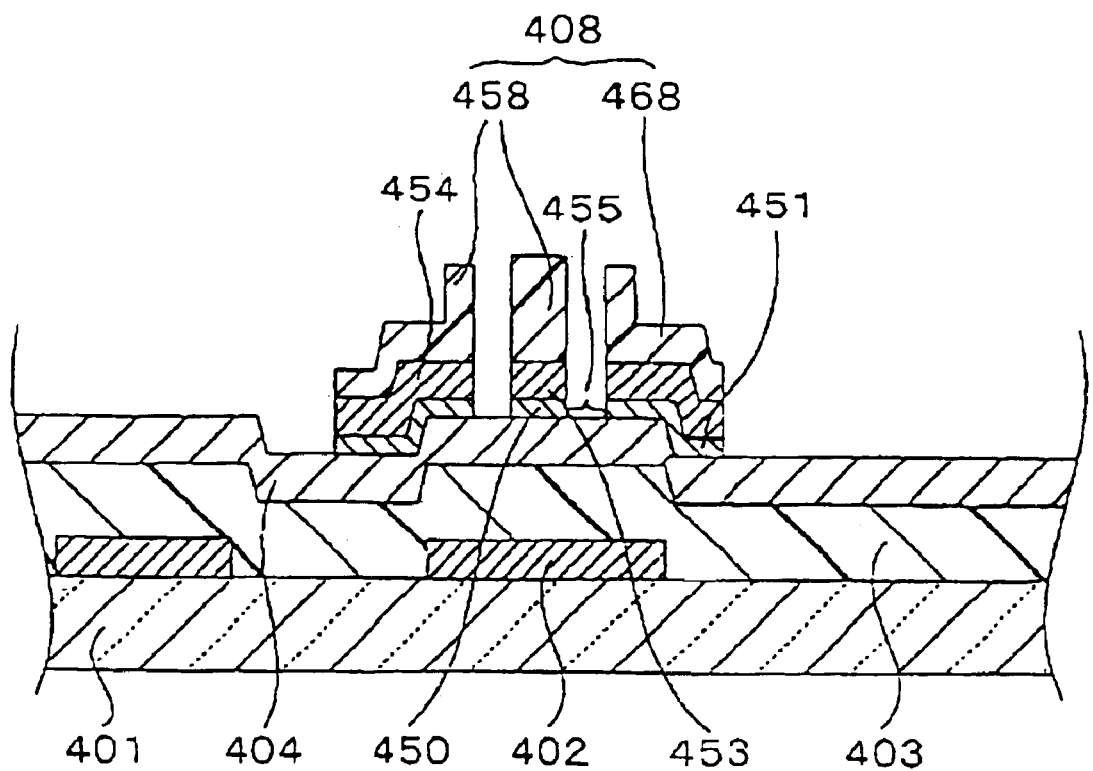
FIG. 21B is a fragmentary cross sectional elevation view of a thin film transistor shown in FIG. 21A, taken along an E–E' line.
Figure 22A:
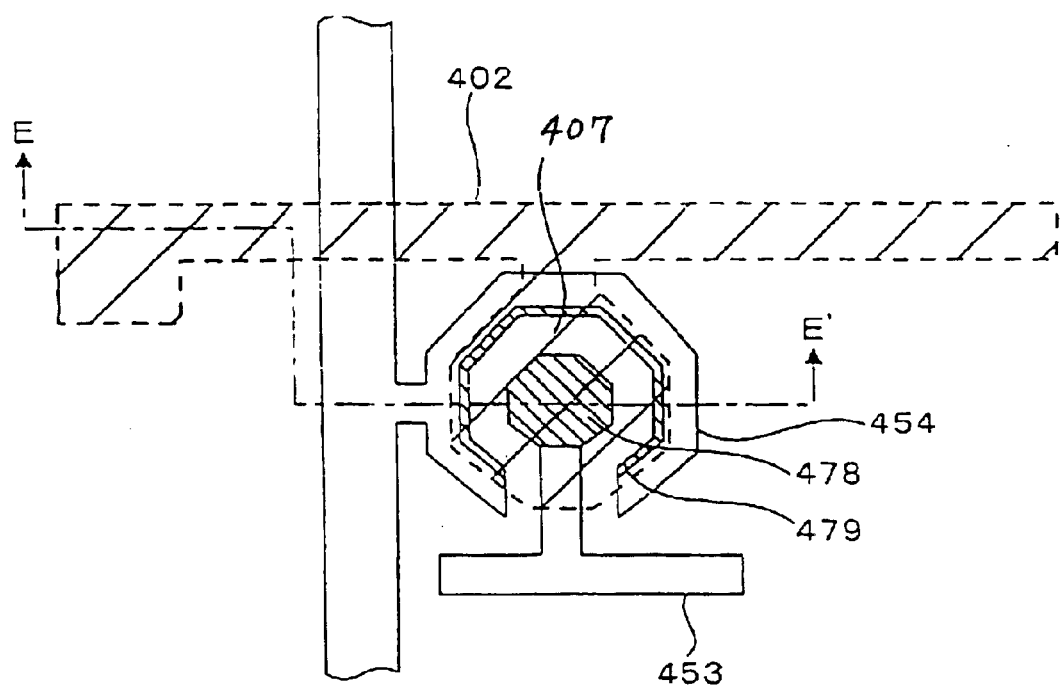
FIG. 22A is a fragmentary plan view of a thin film transistor of a second step involved in novel sequential fabrication processes in a fifth embodiment in accordance with the present invention.
Figure 22B:
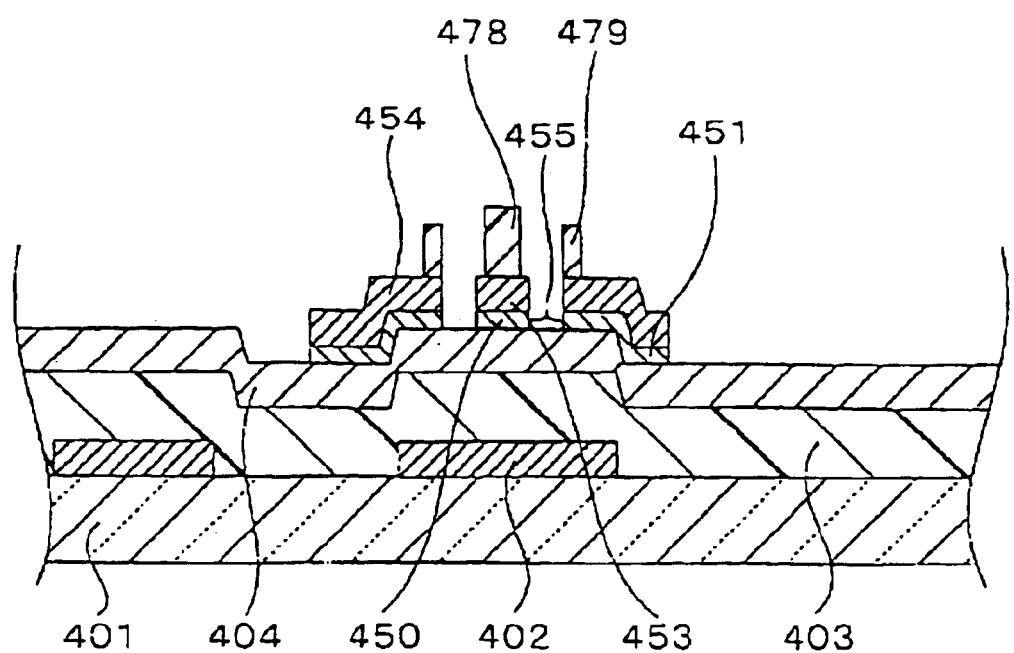
FIG. 22B is a fragmentary cross sectional elevation view of a thin film transistor shown in FIG. 22A, taken along an E–E' line.
Figure 23A:
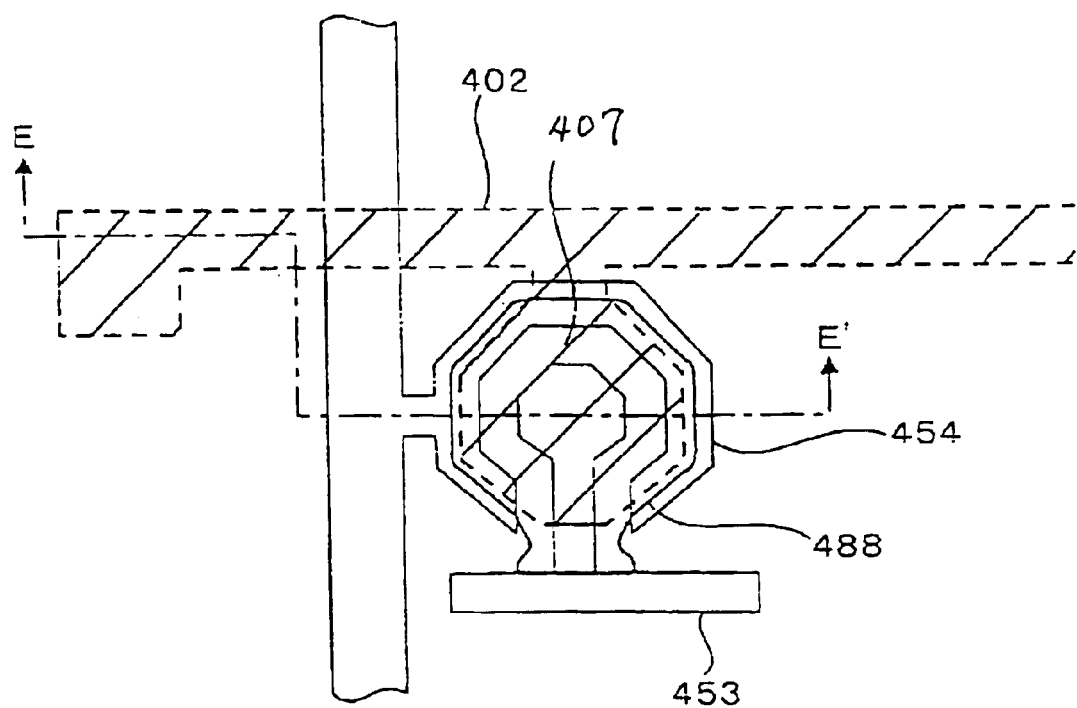
FIG. 23A is a fragmentary plan view of a thin film transistor of a third step involved in novel sequential fabrication processes in a fifth embodiment in accordance with the present invention.
Figure 23B:
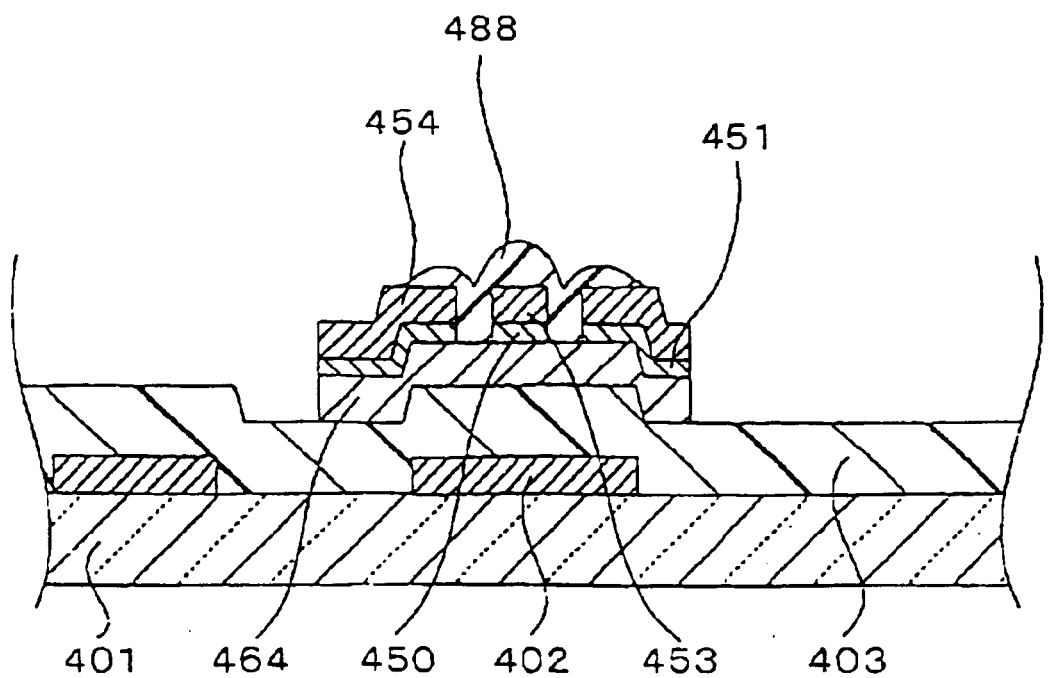
FIG. 23B is a fragmentary cross sectional elevation view of a thin film transistor shown in FIG. 23A, taken along an E–E' line.
Figure 24A:
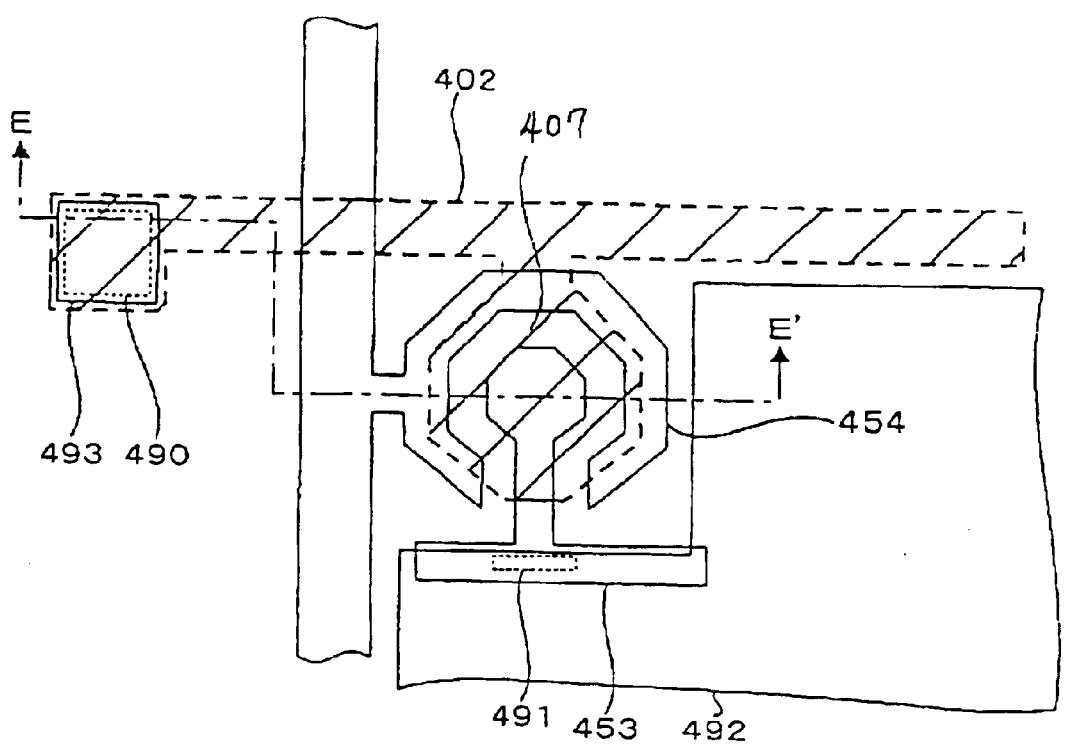
FIG. 24A is a fragmentary plan view of a thin film transistor of a fourth step involved in novel sequential fabrication processes in a fifth embodiment in accordance with the present invention.
Figure 24B:
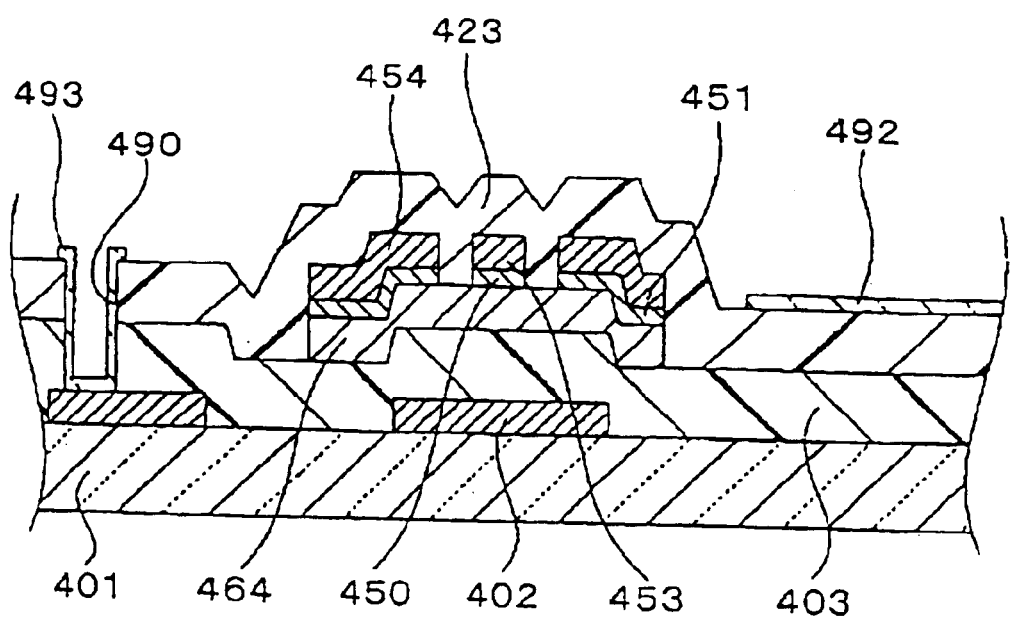
FIG. 24B is a fragmentary cross sectional elevation view of a thin film transistor shown in FIG. 24A, taken along an E–E' line.

A fifth embodiment according to the present invention will be described in detail with reference to the drawings. FIG. 21A is a fragmentary plan view of a thin film transistor of a first step involved in novel sequential fabrication processes in a fifth embodiment in accordance with the present invention. FIG. 21B is a fragmentary cross sectional elevation view of a thin film transistor shown in FIG. 21A, taken along an E–E' line. FIG. 22A is a fragmentary plan view of a thin film transistor of a second step involved in novel sequential fabrication processes in a fifth embodiment in accordance with the present invention. FIG. 22B is a fragmentary cross sectional elevation view of a thin film transistor shown in FIG. 22A, taken along an E–E' line. FIG. 23A is a fragmentary plan view of a thin film transistor of a third step involved in novel sequential fabrication processes in a fifth embodiment in accordance with the present invention. FIG. 23B is a fragmentary cross sectional elevation view of a thin film transistor shown in FIG. 23A, taken along an E–E' line. FIG. 24A is a fragmentary plan view of a thin film transistor of a fourth step involved in novel sequential fabrication processes in a fifth embodiment in accordance with the present invention. FIG. 24B is a fragmentary cross sectional elevation view of a thin film transistor shown in FIG. 24A, taken along an E–E' line. A thin film transistor is formed over an insulating substrate 401.

With reference to FIGS. 21A and 21B, a bottom conductive film is formed over a top surface of the insulating substrate 401. The bottom conductive film is patterned to form a gate electrode interconnection 402. The gate electrode interconnection 402 has a gate electrode 402 which has an octagonal shape in plan view. The gate electrode 402 extends from the gate electrode interconnection 402 in a direction perpendicular to a longitudinal direction of the gate electrode interconnection 402.

A gate insulating film 403 is formed over the insulating substrate 401 and the gate electrode interconnection 402, and the gate electrode 402. An amorphous silicon film 404 is formed over the upper surface of the gate insulating film 403. An n+-type amorphous silicon film 405 is formed over the upper surface of the amorphous silicon film 404. A conductive film 406 is entirely formed over the upper surface of the n+-type amorphous silicon film 405.

A resist mask 408 is selectively formed over the upper surface of the conductive film 206 by use of a lithography technique. The resist mask 408 comprises a thick resist mask 458 and a thin resist mask 468. The thick resist mask 458 is positioned in a selected region which is over the octagonal shape gate electrode 402. The selected region is an octagonal shape region. The thick resist mask 458 may have a thickness of about 3 micrometers. The thin resist mask 468 may have a thickness of about 0.2–0.7 micrometers.

A first etching process is carried out by use of the thick and thin resist masks 458 and 468 for selectively etching the conductive film 406 and the n+-type amorphous silicon film 405. The top conductive film 406 may comprise a metal film. The top conductive film 406 may selectively be etched by a wet etching process to form source and drain electrodes 453 and 454. The n+-type amorphous silicon film 405 may also selectively be etched by a dry etching process under a pressure of 10 Pa, at a power of 1000 W for 60 seconds, wherein source gas flow rate ratios of $SF_6$/HCl/He are 100/100/150 sccm.

As a result of this etching process, the n+-type amorphous silicon film 405 and the conductive film 406 are patterned to form a reflow stopper groove 407 which extends in a form of generally U-shape in plan view. Further, the n+-type amorphous silicon film 405 and the channel region 455 are patterned. The patterned n+-type amorphous silicon film 405 becomes ohmic contact layers 450 and 451. The patterned conductive film 406 becomes source and drain electrodes 453 and 454 adjacent to the channel region 455.

The source electrode 453 extends in a form of combined modified T-shape and octagonal island shape. Namely, the source electrode 453 includes an octagonal shape island portion and a modified T-shaped portion connected with the octagonal shape island portion. The octagonal shape island portion is surrounded by an octagonal shape annular channel region 455. The drain electrode 454 includes an octagonal shape annular surrounding portion which surrounds the octagonal shape island portion of the source electrode 453. The octagonal shape annular surrounding portion of the drain electrode 454 is separate by the octagonal shape annular channel region 455 from the octagonal shape island portion of the source electrode 453. The octagonal shape annular surrounding portion of the drain electrode 454 has an opening side, so that the octagonal shape annular surrounding portion incompletely surrounds the octagonal shape island portion of the source electrode 453. The modified T-shaped portion of the source electrode 453 extends through the opening side to the octagonal shape island portion of the source electrode 453. The modified T-shaped portion of the source electrode 453 also extends outside the opening side of the octagonal shape annular surrounding portion of the drain electrode 454.

With reference to FIGS. 22A and 22B, a plasma ashing process is carried out in the presence of plasma atmosphere with oxygen flow rate at 400 sccm under a pressure of 20 Pa, and an RF power of 1000 W for 120 seconds. This plasma ashing process reduces the thickness of the resist mask 408, whereby the thin resist mask 468 is removed whilst the thick resist mask 458 is reduced in thickness, whereby the thickness-reduced resist mask 458 becomes a first residual resist mask 478 which extends on the octagonal shape island portion of the source electrode 453 and a second residual resist mask 479 which extends on an inside peripheral region of the octagonal shape annular surrounding portion of the drain electrode 454.

With reference to FIGS. 23A and 23B, the residual resist masks 478 and 479 are then exposed to a steam of a solution which contains an organic solvent at 27° C. for 1–3 minutes. This exposure process causes the organic solvent to osmose into the residual resist masks 478 and 479, whereby the residual resist masks 478 and 479 are dissolved and re-flowed, and the residual resist masks 478 and 479 become a reflow-deformed resist mask 488.

A part of the re-flowed resist mask 488 is dropped into the channel region 455, and a part of the dropped re-flowed resist mask 488 in the channel region 455 is further re-flowed out of the opening side of the octagonal shape annular surrounding portion of the drain electrode 454. This further outward re-flow from the opening side is, however, restricted by the modified T-shaped portion of the source electrode 453. The reflow stopper groove 407, thus, comprises the channel region 455 and a region between the opening side of the octagonal shape annular surrounding portion of the drain electrode 454 and the modified T-shaped portion of the source electrode 453.

As a modification, if a opening size of the opening side of the octagonal shape annular surrounding portion of the drain electrode 454 is too narrow as effectively restricting the further outward re-flow, it is possible to modify the T-shaped portion of the source electrode 453 into an I-shape which connects with the octagonal shape island portion of the source electrode 453.

An external shape or a circumferential shape of the reflow-deformed resist mask 488 provides a pattern shape. The external shape or a circumferential shape of the reflow-deformed resist mask 488 is defined by the reflow stopper groove 407 including the channel region 455. The reflow stopper groove 407 enable a highly accurate control or definition to the pattern shape of the reflow-deformed resist mask 488. As long as the reflow stopper groove 207 is highly accurate, the pattern shape of the reflow-deformed resist mask 488 is also highly accurate. Since the highly accurate positioning of the reflow stopper groove 407 is relatively easy by use of the known techniques, it is also relatively easy to obtain the desired highly accurate control or definition to the pattern shape of the reflow-deformed resist mask 488.

A second etching process is carried out by use of the deformed resist mask 488 in combination with the source and drain electrodes 453 and 454 as combined masks for selectively etching the amorphous silicon film 404, whereby the amorphous silicon film 404 becomes an island layer 464 which has a pattern shape which is defined by the deformed resist mask 488 in combination with the source and drain electrodes 453 and 454 as combined masks.

The island layer 464 of amorphous silicon underlies the ohmic contact layers 450 and 451. The island layer 464 is thus electrically connected to the source and drain electrodes 453 and 454. A parasitic capacitance between the gate electrode 402 and the source and drain electrodes 453 and 454 depends on the pattern shape of the island layer 464. Since it is possible to obtain a highly accurate control or definition to the pattern shape of the reflow-deformed resist mask 488 or the pattern shape of the island layer 464, it is possible to obtain a highly accurate control to the parasitic capacitance.

With reference to FIGS. 24A and 24B, the used deformed resist mask 488 is then removed, whereby a thin film transistor is formed. A passivation film 423 is formed. Contact holes 490 and 491 are formed in the passivation film 423. A pixel electrode 492 and a gate terminal electrode 493 are formed.

In the above described embodiment, the reflow of the residual resist masks is caused by exposing the residual resist masks to the steam which contains the solution containing the organic solvent. Any other know methods for causing the re-flow of the resist mask are, of course, available. The re-flow may be caused by applying a heat to the resist mask.

The above novel method is further applicable to deformation to other pattern film than the resist mask, provided the pattern is allowed to be re-flowed by any available measures.

Figure 25A:
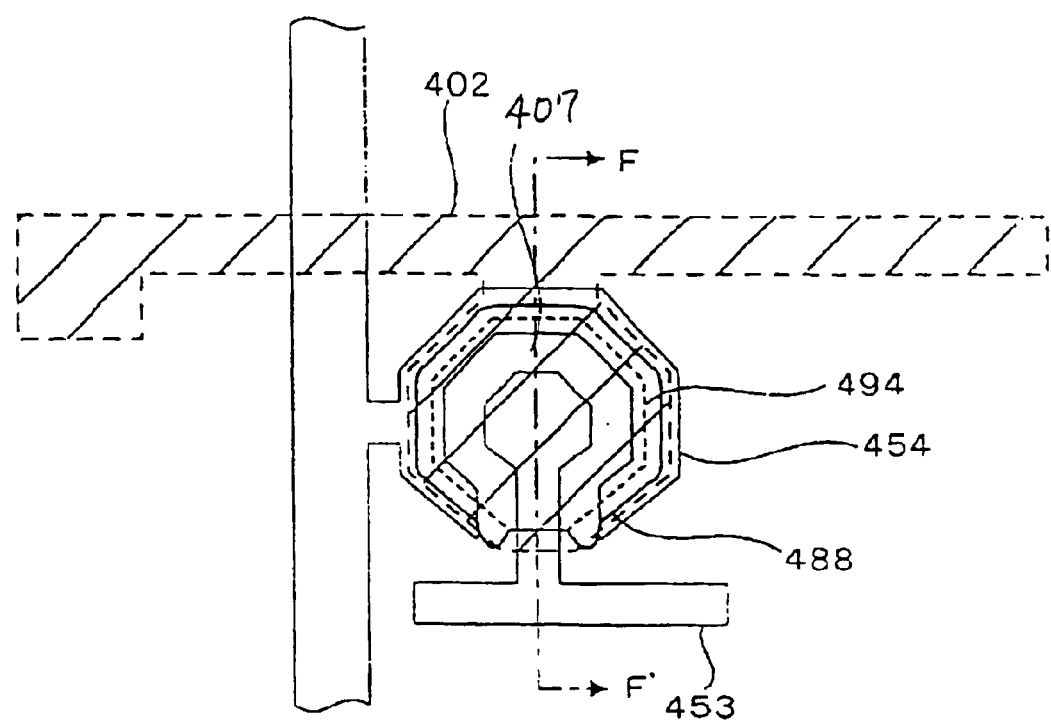
FIG. 25A is a fragmentary plan view of a thin film transistor of a third step involved in novel sequential fabrication processes in a first modification to the fifth embodiment in accordance with the present invention.
Figure 25B:
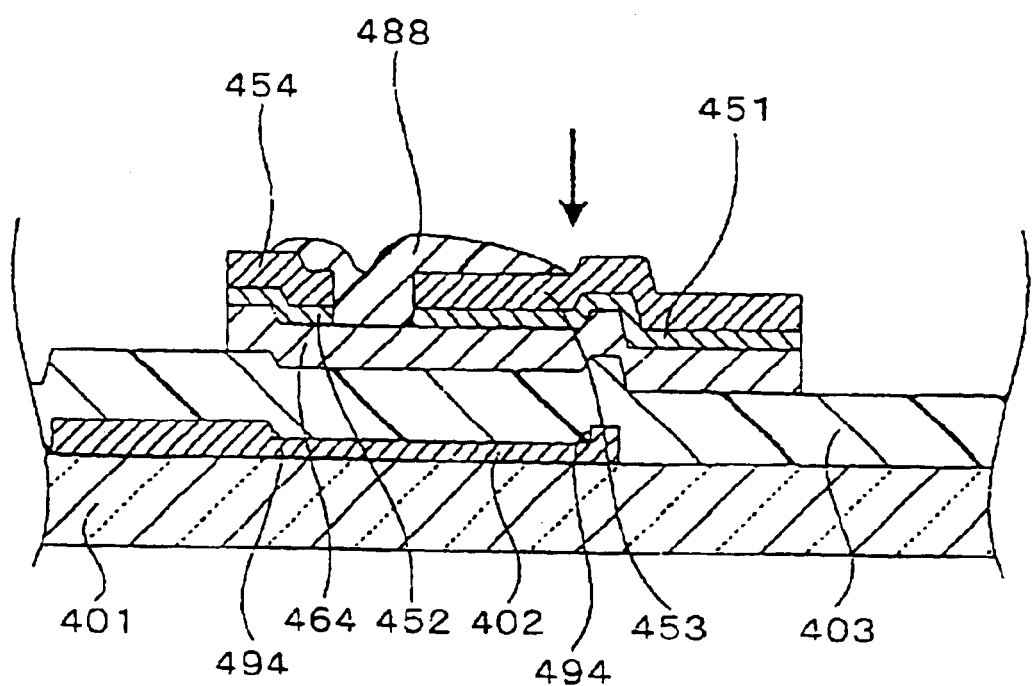
FIG. 25B is a fragmentary cross sectional elevation view of a thin film transistor shown in FIG. 25A, taken along an F–F' line.

The above described novel method of the fifth embodiment may be modified as follows. FIG. 25A is a fragmentary plan view of a thin film transistor of a third step involved in novel sequential fabrication processes in a first modification to the fifth embodiment in accordance with the present invention. FIG. 25B is a fragmentary cross sectional elevation view of a thin film transistor shown in FIG. 25A, taken along an F–F' line.

The following descriptions will focus on the difference of the first modified method from the above novel method of the fifth embodiment. In the above novel method of the fifth embodiment, the gate electrode 402 and the gate electrode interconnection 402 have the same level and the same thickness. The re-flow stopper groove 407 also comprises the channel region 455 and the region between the opening side to the octagonal shape island portion of the source electrode 453 and the modified T-shaped portion of the source electrode 453. In this first modification, however, the octagonal shape gate electrode 402 is thickness-reduced except for an outside peripheral edge thereof. The outside peripheral edge of the octagonal shape gate electrode 402 have the same thickness as the gate electrode interconnection 402. A step is formed at a boundary between the thickness reduced region and the outside peripheral edge. This step of the gate electrode 402 causes a step of the modified T-shaped portion of the source electrode 453 and a step of the octagonal shape annular surrounding portion of the drain electrode 454. The step of the modified T-shaped portion of the source electrode 453 and the step of the octagonal shape annular surrounding portion of the drain electrode 454 serve as a reflow stopper wall. In this case, a peripheral edge of the reflow stopper groove 407 is defined by the step of the modified T-shaped portion of the source electrode 453 and the step of the octagonal shape annular surrounding portion of the drain electrode 454.

In this modification, the step of the modified T-shaped portion of the source electrode 453 and the step of the octagonal shape annular surrounding portion of the drain electrode 454 are formed by the thickness-reduced portion of the gate electrode 402. It is alternatively possible that a recessed portion is formed in the substrate 401, wherein a step is formed on the peripheral edge of the recessed portion.

Figure 26A:
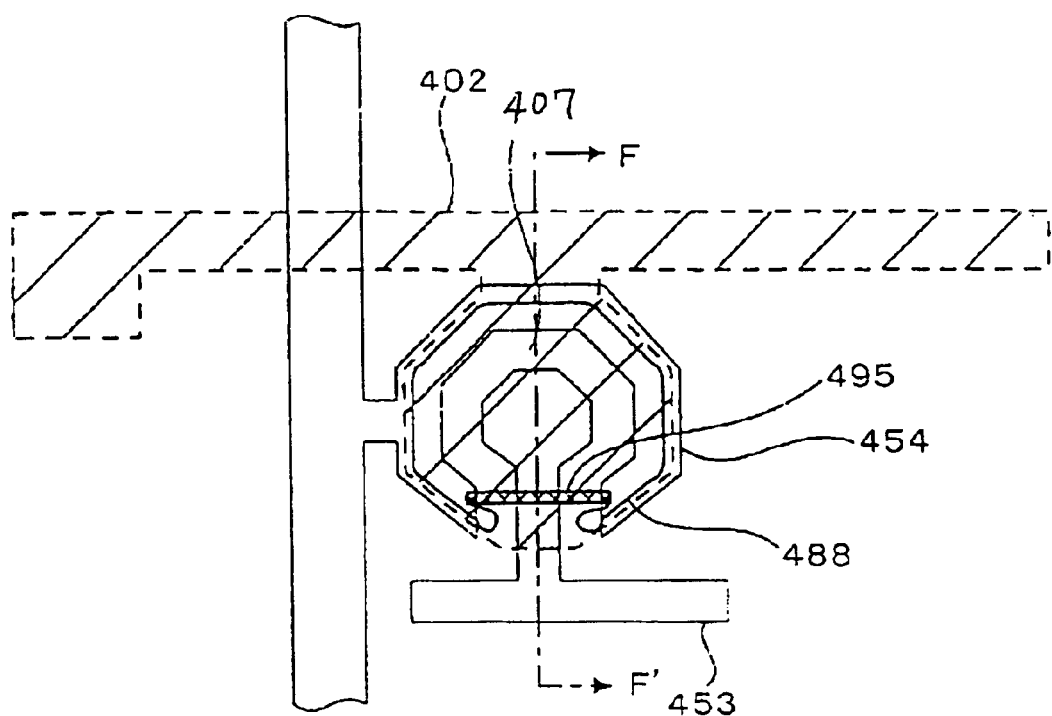
FIG. 26A is a fragmentary plan view of a thin film transistor of a third step involved in novel sequential fabrication processes in a second modification to the fifth embodiment in accordance with the present invention.
Figure 26B:
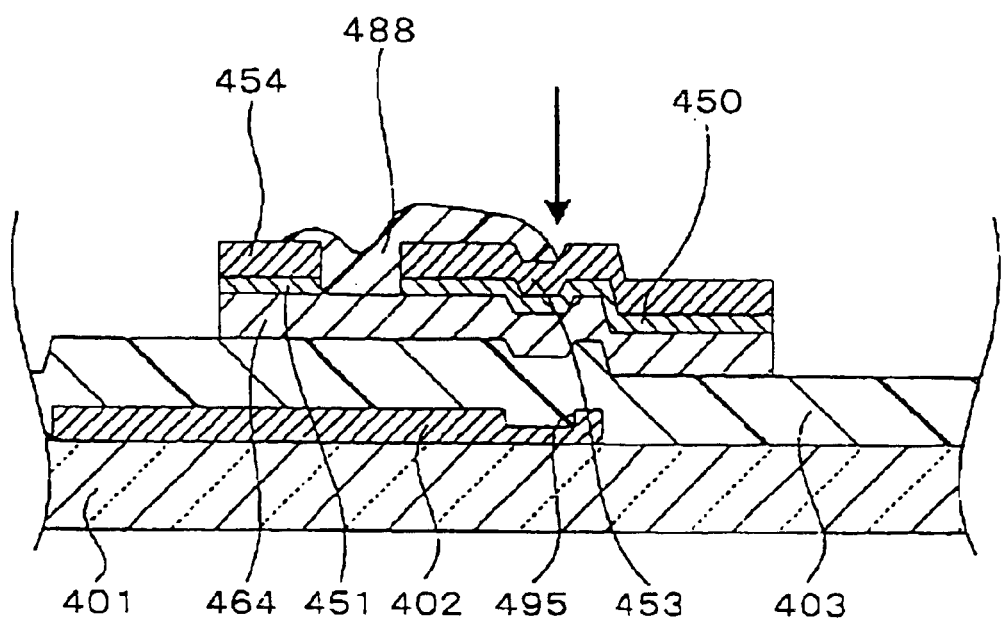
FIG. 26B is a fragmentary cross sectional elevation view of a thin film transistor shown in FIG. 26A, taken along an F–F' line.

Alternatively, the above described novel method of the fifth embodiment may be modified as follows. FIG. 26A is a fragmentary plan view of a thin film transistor of a third step involved in novel sequential fabrication processes in a second modification to the fifth embodiment in accordance with the present invention. FIG. 26B is a fragmentary cross sectional elevation view of a thin film transistor shown in FIG. 26A, taken along an F–F' line.

The following descriptions will focus on the difference of the second modified method from the above novel method of the fifth embodiment. In the above novel method of the fifth embodiment, the gate electrode 402 and the gate electrode interconnection 402 have the same level and the same thickness. The re-flow stopper groove 407 also comprises the channel region 455 and the region between the opening side to the octagonal shape island portion of the source electrode 453 and the modified T-shaped portion of the source electrode 453. In this first modification, however, the octagonal shape gate electrode 402 has a thickness-reduced region 495. A step is formed at a peripheral edge of the thickness-reduced region 495. This step of the gate electrode 402 causes a groove extending over the channel region 455 and the modified T-shaped portion of the source electrode 453. In this case, a peripheral edge of the reflow stopper groove 407 is defined by the channel region 455 and the groove positioned over the thickness-reduced region 495 of the gate electrode 402.

In this modification, the groove is formed by the thickness-reduced region 495 of the gate electrode 402. It is alternatively possible that a recessed portion is formed in the substrate 401, wherein the groove is formed on the peripheral edge of the recessed portion.

Figure 27A:
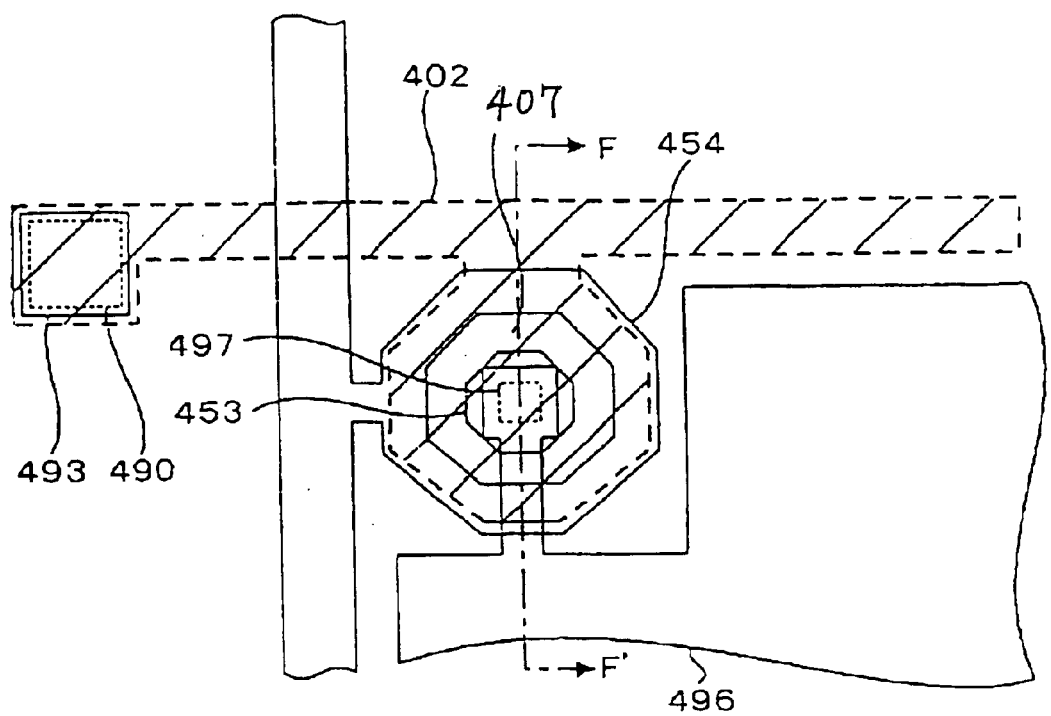
FIG. 27A is a fragmentary plan view of a thin film transistor of a third step involved in novel sequential fabrication processes in a third modification to the fifth embodiment in accordance with the present invention.
Figure 27B:
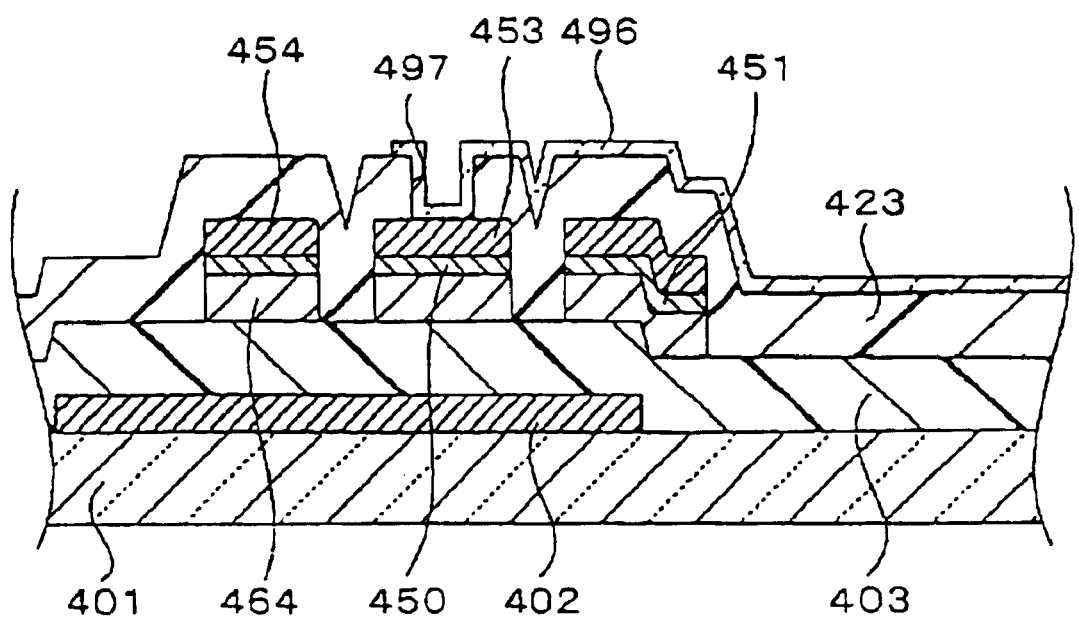
FIG. 27B is a fragmentary cross sectional elevation view of a thin film transistor shown in FIG. 27A, taken along an F–F' line.

Further, alternatively, the above described novel method of the fifth embodiment may be modified as follows. FIG. 27A is a fragmentary plan view of a thin film transistor of a third step involved in novel sequential fabrication processes in a third modification to the fifth embodiment in accordance with the present invention. FIG. 27B is a fragmentary cross sectional elevation view of a thin film transistor shown in FIG. 27A, taken along an F–F' line.

The following descriptions will focus on the difference of the third modified method from the above novel method of the fifth embodiment. The source electrode 453 extends in a form of octagonal island shape. Namely, the source electrode 453 includes an octagonal shape island portion. The octagonal shape island portion is surrounded by an octagonal shape annular channel region 455. The drain electrode 454 includes an octagonal shape annular surrounding portion which surrounds completely the octagonal shape island source electrode 453. The octagonal shape annular surrounding portion of the drain electrode 454 is separate by the octagonal shape annular channel region 455 from the octagonal shape island source electrode 453. The octagonal shape annular surrounding portion of the drain electrode 454 has no opening side, so that the octagonal shape annular surrounding portion completely surrounds the octagonal shape island source electrode 453. In this case, the reflow stopper groove 407 extends on the channel region 455.

A passivation film 423 is formed. A contact hole 497 is formed in the passivation film 423, so that the contact hole 497 is positioned over the octagonal shape island portion of the source electrode 453. A pixel electrode 496 is formed on the passivation film 423, wherein the pixel electrode 496 is connected through the contact hole 497 to the octagonal shape island source electrode 453.

In the foregoing embodiments, the selected region, on which the residual resist film remains, is preferably decided. The position of the selected region is optional, provided that the selected region is positioned inside the reflow stopper groove, so that the outward reflow of the resist film is stopped or restricted by the reflow stopper groove extending outside the resist film.

As modifications to the foregoing embodiments, the above re-flow stopper groove may be formed by forming a groove or a level-down region on an upper surface of the substrate.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A semiconductor device including a layered-structure over a substrate, wherein an upper surface of said substrate has at least a groove, and an upper surface of said layered-structure also has at least a groove which is positioned over said groove of said substrate, and wherein said groove of said substrate selectively extends adjacent to a channel region.

2. The semiconductor device as claimed in claim 1, wherein said groove of said substrate extends around said channel region in plan view.

3. The semiconductor device as claimed in claim 2, wherein said groove of said substrate surrounds completely.

4. The semiconductor device as claimed in claim 2, wherein said groove of said substrate surrounds incompletely.

5. A semiconductor device including a layered-structure over a substrate, wherein an upper surface of said substrate has at least a level-down region , and an upper surface of said layered-structure also has at least a groove which extends over said level-down region of said substrate, and wherein said level-down region of said substrate selectively extends including a channel region in plan view.

* * * * *